United States Patent [19]
Koda et al.

[11] Patent Number: 6,114,859
[45] Date of Patent: Sep. 5, 2000

[54] HARMONIC CHARACTERISTIC MEASURING METHOD AND HARMONIC CHARACTERISTIC MEASURING APPARATUS

[75] Inventors: Isao Koda; Masakazu Tsukamoto; Yasuhiro Fuwa, all of Aichi; Shoji Nishimura, Kyoto; Yoshifumi Minowa, Kyoto; Yasuyuki Natsuda, Kyoto, all of Japan

[73] Assignees: Nissin Electric Co., Ltd., Kyoto; Chuba Electric Power Co., Inc., Nagoya, both of Japan

[21] Appl. No.: 09/114,133

[22] Filed: Jul. 13, 1998

[30] Foreign Application Priority Data

| | | | |
|---|---|---|---|
| Jul. 14, 1997 | [JP] | Japan | 9-205408 |
| Nov. 25, 1997 | [JP] | Japan | 9-340676 |
| Feb. 17, 1998 | [JP] | Japan | 10-052852 |

[51] Int. Cl.$^7$ .......................... G01R 27/28; G01R 23/20; G01R 23/16; G01R 25/00; H02H 3/26
[52] U.S. Cl. ........................ 324/619; 324/623; 324/76.21; 361/76; 702/65
[58] Field of Search ..................... 324/619, 623, 324/76.21; 702/65; 361/76; 307/105, 13, 14

[56] References Cited

U.S. PATENT DOCUMENTS 4,037,138  7/1977  Kobayashi ................. 361/20
5,933,793  8/1999  Yamada ..................... 324/623

*Primary Examiner*—Safet Metjahic
*Assistant Examiner*—James C Kerveros
*Attorney, Agent, or Firm*—Finnegan, Henderson, Farabow, Garrett & Dunner, L.L.P.

[57] ABSTRACT

Single-phase currents at two frequencies $f\alpha$ and $f\beta$ ($f\alpha < n \cdot fs < f\beta$) of non-integral multiples of a system fundamental wave frequency fs sandwiching an targeted harmonic (frequency $n \cdot fs$) are injected between two phases of a three-phase power system as interharmonic currents. A frequency analysis of measurement current and measurement voltage of each phase in the system is carried out and a positive-phase-sequence current I1, a positive-phase-sequence voltage V1, a negative-phase-sequence current I2, and a negative-phase-sequence voltage V2 are detected for each of the two frequencies $f\alpha$ and $f\beta$ in the system based on injecting of the interharmonic currents. Positive-phase-sequence and negative-phase-sequence admittances Y1 and Y2 or positive-phase-sequence and negative-phase-sequence impedances Z1 and Z2 are found for each of the frequencies $f\alpha$ and $f\beta$ in the system as Y1=I1/V1 and Y2=I2/V2 or Z1=V1/I1 and Z2=V2/I2. Interpolation operation is performed for finding positive-phase-sequence and negative-phase-sequence admittances or positive-phase-sequence and negative-phase-sequence impedances for the targeted harmonic in the system from the admittances Y1 and Y2 or the impedances Z1 and Z2 for the frequencies $f\alpha$ and $f\beta$.

7 Claims, 9 Drawing Sheets

HARMONIC CHARACTERISTIC MEASURING METHOD AND HARMONIC CHARACTERISTIC MEASURING APPARATUS

BACKGROUND OF THE INVENTION

1. Field of the Invention

The present invention relates to a harmonic characteristic measuring method and a harmonic characteristic measuring apparatus.

2. Description of the Related Art

Conventionally, it has been important to decrease harmonics by making an appropriate filter capacity, etc., in a power sending and distributing system, namely, a three-phase power system.

The n-order (n is an integer of 1, 2, ...) harmonic (nth harmonic) is an integral multiple of system fundamental wave frequency fs and a representative frequency of the fifth harmonic is 5·fs.

To decrease the harmonic, a harmonic level (voltage level) is predicted and a filter facility of the frequency is added to a capacitor facility, etc.

To predict the harmonic level, it is important to keep track of the harmonic characteristic downstream (load side) from the connection point of the filter facility, for example, of the three-phase power system and find its equivalent circuit (harmonic equivalent circuit), etc.

At this time, if the harmonic equivalent circuit is represented by the Norton theorem, it can be assumed to be a parallel circuit of admittance and a current source and the admittance is the most important to keep track of the characteristic.

It is described on Denkigakkai ronbunshi B, vol. 101 No. 8, p.451–p.458 (August, 1988) that when a harmonic equivalent circuit is found for the fifth harmonic of a power distribution system, the voltage and current of a fundamental wave in the system are measured and the admittance of the harmonic equivalent circuit, the current source size and phase, and the like are calculated and estimated from the measurement result.

However, to measure the harmonic characteristic of a three-phase power system by the measurement method described here, the voltage and current of the fundamental wave in the system are measured and the admittance of the targeted harmonic of the fifth harmonic, etc., the harmonic current source size and phase are estimated indirectly from the measurement result, thus it is impossible to keep track of the harmonic characteristic with good accuracy.

Thus, it is impossible to keep track of the harmonic characteristic of the three-phase power system precisely for installing an appropriate filter facility, etc., and a good decrease in the harmonic level cannot be carried out.

The present applicant already invents the following harmonic characteristic measuring method according to Japanese Patent Application No. Hei 8-310192: Currents at non-integral multiple frequencies of fundamental waves on both the upper and lower sides of measured harmonic (targeted harmonic) are injected into a harmonic injection point in a power system, admittances of equivalent circuits point to the injection frequencies on both the upper and lower sides of the targeted harmonic downstream or upstream from the injection point in the system are found based on the actual measurement results of voltages at the injection frequencies at the injection point and currents at the injection frequencies flowing upstream and downstream from the injection point, and the admittance of equivalent circuit to the targeted harmonic is determined by performing interpolation processing, thereby measuring the harmonic characteristic of the targeted harmonic.

In this case, the currents at the injection frequencies are currents of so-called interharmonics of non-integral multiples of the fundamental wave frequency not originally existing in the system, the admittances of the equivalent circuits to the injection frequencies can be found with accuracy from actual measurement without receiving the effect of already existing harmonics in the system, and the result can be used to keep track of the harmonic characteristic of the targeted harmonic with accuracy.

To execute the harmonic characteristic measuring method described in Japanese Patent Application No. Hei 8-310192, it is necessary to injection interharmonic currents of two frequencies fα and fβ (fα<n·fs<fβ) of non-integral multiples of the system fundamental wave frequency fs sandwiching the nth targeted harmonic to be measured (frequency n·fs) into the power system.

It is possible to injection current into each phase of a three-phase power system as currents at the two frequencies fα and fβ.

However, if an attempt is made to measure a harmonic characteristic by injecting current into the three phases, a device of a three-phase capacity becomes necessary as a current injecting device at the two frequencies fα and fβ and the injected current amount cannot be lessened in measuring.

To measure a harmonic characteristic in a power system for one or more harmonics by the harmonic characteristic measuring method described above, it is necessary to not only injection each interharmonic current into the power system, but also collect and process measurement current and voltage data in the power system based on the injecting; it is desired to collect and process the data automatically and rapidly.

In the harmonic characteristic measuring method described above, if an interharmonic frequency component exists in the system, it becomes noise, causing a measurement error to occur.

Therefore, hitherto, interharmonic current has been set to a comparatively large, proper level before being injected into a power system.

Thus, a large-capacity, large-scaled current injecting device becomes required for injecting interharmonic; a harmonic characteristic in a power system cannot be measured in a small injection capacity.

The following method is also possible: An interharmonic injecting point system (injection system) and a measurement point system (measurement system) are made different, a system upstream from the injection system or any branch system other than the injection system downstream from the upstream system is adopted as the measurement system, and a harmonic characteristic in the upstream system or the branch system is measured for enlarging the measurement range to the outside of the injection system.

However, as the interharmonic injecting point and the measurement point become distant from each other, the injected current measurement level lowers.

Particularly in an upstream system, the injected current measurement level furthermore lowers due to the transforming station transformer between the systems.

Thus, if a measurement point is set in an upstream system or a branch system, the noise effect becomes extremely large and a measurement error becomes large; in fact, the measurement range cannot be enlarged.

SUMMARY OF THE INVENTION

It is therefore an object of the invention to provide a new, small-sized measuring apparatus for injecting single-phase currents and measuring a harmonic characteristic in a three-phase power system.

It is another object of the invention to provide a harmonic characteristic measuring apparatus for automatically injecting currents of interharmonics and collecting data of measurement voltages and measurement currents in a power system based on injecting of the interharmonic currents under so-called sequential control.

At the time, injecting and measuring of a transient fluctuation component when a change is made to the frequency of each interharmonic are prevented and when an abnormal condition occurs in the apparatus or the power system, injecting is inhibited and the protective operation is performed preferentially for enhancing performance and reliability of the apparatus. Also, one-time injecting of the current of each interharmonic from any timing or repetitive (continuous) injecting can be selected for improving the function of the apparatus.

It is another object of the invention to make it possible to exclude the effect of noise existing in a power system, measure the harmonic characteristic in the power system with accuracy in a small injecting capacity, and enlarge the measurement range.

To the ends, according to a first aspect of the invention, there is provided a harmonic characteristic measuring method comprising the steps of:

injecting single-phase currents at two frequencies fα and fβ (fα<n·fs<fβ) of non-integral multiples of a system fundamental wave frequency fs sandwiching an n-order targeted harmonic to be measured (frequency n·fs) between two phases of a three-phase power system as interharmonic currents;

carrying out a frequency analysis of measurement current and measurement voltage of each phase in the power system and detecting a positive-phase-sequence current I1, a positive-phase-sequence voltage V1, a negative-phase-sequence current I2, and a negative-phase-sequence voltage V2 for each of the two frequencies fα and fβ in the power system based on injecting of the interharmonic currents;

finding positive-phase-sequence and negative-phase-sequence admittances Y1 and Y2 or positive-phase-sequence and negative-phase-sequence impedances Z1 and Z2 for each of the two frequencies fα and fβ in the power system as Y1=I1/V1 and Y2=I2/V2 or Z1=V1/I1 and Z2=V2/I2; and performing interpolation operation to find positive-phase-sequence and negative-phase-sequence admittances or positive-phase-sequence and negative-phase-sequence impedances for the targeted harmonic in the power system from the admittances Y1 and Y2 or the impedances Z1 and Z2 for the two frequencies fα and fβ.

Therefore, single-phase currents are injected between two phases of the three-phase power system as the currents of the interharmonics of the two frequencies fα and fβ, whereby the positive-phase-sequence and negative-phase-sequence admittances or the positive-phase-sequence and negative-phase-sequence impedances for the targeted harmonic in the system are found.

Particularly in an ungrounded system such as a power distribution system, zero-phase-sequence components need not be considered and the characteristic can be grasped according to the positive-phase-sequence and negative-phase-sequence components.

That is, if single-phase current is injected into such a ungrounded system, the system admittance (impedance) viewed from the injection point is determined almost by impedance (transformer impedance) of an upstream system transformer (bank transformer) independently of the load as three-phase current is injected, and the relationship among the positive-phase-sequence and negative-phase-sequence currents and voltages in the system becomes similar to that when three-phase current is injected. Thus, the positive-phase-sequence and negative-phase-sequence admittances Y1 and Y2 or the positive-phase-sequence and negative-phase-sequence impedances Z1 and Z2 (reciprocals of the admittances) for the two frequencies fα and fβ in the three-phase power system are found based on the positive-phase-sequence current I1, the positive-phase-sequence voltage V1, the negative-phase-sequence current I2, and the negative-phase-sequence voltage V2 measured by injecting the single-phase current.

From the admittances Y1 and Y2 or the impedances Z1 and Z2 for the two frequencies fα and fβ, the positive-phase-sequence and negative-phase-sequence admittances or impedances for the targeted harmonic of the intermediate frequency are found by performing interpolation operation and the harmonic characteristic for the targeted harmonic is measured.

At this time, the currents at the frequencies fα and fβ are currents at frequencies not existing in the power system, thus the admittances Y1 and Y2 or the impedances Z1 and Z2 can be found with accuracy without receiving the harmonic effect in the system. Resultantly, the positive-phase-sequence and negative-phase-sequence admittances or impedances for the targeted harmonic can be found with accuracy and the harmonic characteristic can be measured with high accuracy.

Since single-phase current may be injected into the power system, the current injecting amount may be ⅓ that when three-phase current is injected (3 denotes a square root of 3) and measuring can be performed by injecting current of an extremely small capacity as compared with the case where three-phase current is injected.

According to a second aspect of the invention, there is provided a harmonic characteristic measuring method comprising the steps of:

injecting single-phase currents at two frequencies fα and fβ (fα<n·fs<fβ) of non-integral multiples of a system fundamental wave frequency fs sandwiching an n-order targeted harmonic to be measured (frequency n·fs) between two phases of a three-phase power system as interharmonic currents;

carrying out a frequency analysis of measurement current and measurement voltage of each phase in the power system and detecting a positive-phase-sequence current I1 and a positive-phase-sequence voltage V1 or a negative-phase-sequence current I2 and a negative-phase-sequence voltage V2 for each of the two frequencies fα and fβ in the power system based on injecting of the interharmonic currents;

finding positive-phase-sequence admittance Y1 or negative-phase-sequence admittance Y2 or positive-phase-sequence impedance Z1 or negative-phase-sequence impedance Z2 for each of the two frequencies fα and fβ in the power system as Y1=I1/V1 or Y2=I2/V2 or Z1=V1/I1 or Z2=V2/I2; and performing interpolation operation to find positive-phase-sequence or negative-phase-sequence admittance or positive-phase-sequence or negative-phase-sequence impedance for the targeted harmonic in the power system from the positive-phase-sequence admittance Y1 or the negative-phase-sequence admittance Y2 or the positive-phase-sequence impedance Z1 or the negative-phase-sequence impedance Z2 for the two frequencies fα and fβ.

Therefore, in this case, the positive-phase-sequence or negative-phase-sequence admittance or the positive-phase-sequence or negative-phase-sequence impedance for the targeted harmonic can be found with accuracy and the harmonic characteristic can be measured with high accuracy by injecting single-phase current of a small capacity According to a third aspect of the invention, there is provided a harmonic characteristic measuring apparatus comprising:

a current injecting device of single-phase output for injecting single-phase currents at two frequencies fα and fβ (fα<n·fs<fβ) of non-integral multiples of a system fundamental wave frequency fs sandwiching an n-order targeted harmonic to be measured (frequency n·fs) between two phases of a three-phase power system as interharmonic currents;

a current transformer for measuring the current of each phase in the power system;

a transformer for measuring the voltage of each phase in the power system;

signal processing means for carrying out a frequency analysis of three-phase measurement signals of the current transformer and the transformer and detecting a positive-phase-sequence current I1, a positive-phase-sequence voltage V1, a negative-phase-sequence current I2, and a negative-phase-sequence voltage V2 for each of the two frequencies fα and fβ in the power system based on injecting of the interharmonic currents; and arithmetic processing means for finding positive-phase-sequence and negative-phase-sequence admittances Y1 and Y2 or positive-phase-sequence and negative-phase-sequence impedances Z1 and Z2 for each of the two frequencies fα and fβ in the power system from calculation of Y1=I1/V1 and Y2=I2/V2 or Z1=V1/I1 and Z2=V2/I2 based on the detection result of the signal processing means and performing interpolation operation to find positive-phase-sequence and negative-phase-sequence admittances or positive-phase-sequence and negative-phase-sequence impedances for the targeted harmonic in the power system from the admittances Y1 and Y2 or the impedances Z1 and Z2 for the two frequencies fα and fβ.

According to a fourth aspect of the invention, there is provided a harmonic characteristic measuring apparatus comprising:

a current injecting device of single-phase output for injecting single-phase currents at two frequencies fα and fβ (fα<n·fs<fβ) of non-integral multiples of a system fundamental wave frequency fs sandwiching an n-order targeted harmonic to be measured (frequency n·fs) between two phases of a three-phase power system as interharmonic currents;

a current transformer for measuring the current of each phase in the power system;

a transformer for measuring the voltage of each phase in the power system;

signal processing means for carrying out a frequency analysis of three-phase measurement signals of the current transformer and the transformer and detecting a positive-phase-sequence current I1 and a positive-phase-sequence voltage V1 or a negative-phase-sequence current I2 and a negative-phase-sequence voltage V2 for each of the two frequencies fα and fβ in the power system based on injecting of the interharmonic currents; and arithmetic processing means for finding positive-phase-sequence admittance Y1 or negative-phase-sequence admittance Y2 or positive-phase-sequence impedance Z1 or negative-phase-sequence impedance Z2 for each of the two frequencies fα and fβ in the power system from calculation of Y1=I1/V1 or Y2=I2/V2 or Z1=V1/I1 or Z2=V2/I2 based on the detection result of the signal processing means and performing interpolation operation to find positive-phase-sequence or negative-phase-sequence admittance or positive-phase-sequence or negative-phase-sequence impedance for the targeted harmonic in the power system from the positive-phase-sequence admittance Y1 or the negative-phase-sequence admittance Y2 or the positive-phase-sequence impedance Z1 or the negative-phase-sequence impedance Z2 for the two frequencies fα and fβ.

Therefore, the harmonic characteristic measuring apparatus according to the third or fourth aspect of the invention can measure the harmonic characteristic for the targeted harmonic in the three-phase power system by the harmonic characteristic measuring method according to the first or second aspect of the invention. At the time, the current injecting device can have the capacity decreased to ⅓ that for injecting three-phase current and can be downsized.

According to a fifth aspect of the invention, there is provided a harmonic characteristic measuring apparatus comprising:

a injecting section for injecting a current wherein an output frequency is variably set, the injecting section being controlled so as to injection an output current at a setup frequency into the power system or stop injecting the output current as a injection gate is opened or closed; and a measuring section having a function of controlling injecting of the injecting section and a function of collecting the data of the measurement current and the measurement voltage;

the measuring section comprising:

means for determining selection of one-time measurement of starting sequential injecting of current of each interharmonic according to a manual trigger and terminating the current injecting by executing once or continuous measurement of repeating sequential injecting of current of each interharmonic according to timing control;

means for forming a injection signal for controlling an output frequency, supplying the signal to the injection section 106, and varying the output current to current of each interharmonic in sequence once or repeatedly in accordance with selection of one-time or continuous measurement by the injection signal;

means for forming a injection gate signal for commanding the injection gate to be opened or closed, supplying the signal to the injection section, and opening the injection gate for allowing the output current to be injected into the power system in a stable period until the injection signal changes to the next interharmonic current signal after the output current changes to current of each interharmonic;

means for collecting data of the measurement current and measurement voltage in the power system in the stable period; and means for forcibly stopping injecting of the injection section and allowing protective operation to be performed preferentially when an abnormal condition occurs according to interrupt processing based on abnormal condition notification from the injection section, abnormal condition detection in the power system, etc.

Therefore, the output frequency of the injecting section is variably changed to the frequency of each interharmonic once or repeatedly in response to one-time or continuous measurement based on the injection signal supplied from the measuring section to the injecting section and the output current of the injecting section is automatically changed to the current of each interharmonic one or repeatedly.

As the injection gate is opened or closed based on the injection gate signal supplied from the measuring section to the injecting section, the injecting section injections only stable current of each interharmonic to the power system once or repeatedly without injecting current in the transient period in which the output frequency is changed to the frequency of each interharmonic.

The data of the measurement current and measurement voltage in the power system based on injecting of the stable current of each interharmonic with no transient fluctuation is automatically collected in the measuring section.

Further, when an abnormal condition occurs in the apparatus or the power system, the measuring section allows the protective operation to take precedence over others and causes the injecting section to forcibly stop injecting for reliably preventing unnecessary current from being injected into the power system and protecting the apparatus from the abnormal condition in the system, etc.

When one-time measuring is selected, interharmonic currents are injected into the power system in sequence only once at any timing based on a manual trigger for automatic measuring. When continuous measuring is selected, interharmonic currents are injected into the power system repeatedly under timing control of the measuring section for continuous measuring.

According to a sixth aspect of the invention, there is provided a harmonic characteristic measuring method comprising the steps of:

measuring voltage and current at the frequency of each interharmonic in the power system before and after the current of each interharmonic is injected as voltage and current of noise of each interharmonic existing in the system;

correcting the measurement voltage and measurement current of each interharmonic in the power system based on injecting of the current of each interharmonic by subtracting the voltage and current of noise of each interharmonic.

Therefore, from the voltage and current of each interharmonic in the power system measured by injecting the current of each interharmonic, the voltage and current of noise existing in the system at the frequency are subtracted for removing the effect thereof.

Thus, the voltage and current based on injecting of each interharmonic in the power system can be measured with accuracy by injecting current of a small capacity independently of the magnitude of noise existing in the system at the frequency of each interharmonic, and the harmonic characteristic can be measured with accuracy in a small injection capacity.

Moreover, when the measuring system is made a different system from the injecting system, such as a system upstream from the injection system, the voltage and current of existing noise at the frequency of each interharmonic in the measuring system are measured, whereby the voltage and current of each interharmonic in the measuring system based on current injecting can be measured with accuracy and the harmonic characteristic can be measured; the measuring range can be enlarged.

According to a seventh aspect of the invention, there is provided a harmonic characteristic measuring method comprising the steps of:

measuring voltage and current at the frequency of each interharmonic in the power system before and after the current of each interharmonic is injected more than once as voltage and current of noise of each interharmonic existing in the system;

finding an average of results of measuring more than once the voltage and current of noise of each interharmonic;

correcting the measurement voltage and measurement current of each interharmonic in the power system based on injecting of the current of each interharmonic by subtracting the averaged voltage and current of noise of each interharmonic.

Therefore, in this case, the voltage and current of noise at the frequency of each interharmonic existing in the system is measured furthermore accurately with transient fluctuation, etc., prevented by averaging the results of measuring more than once. The voltage and current based on injecting of each interharmonic in the power system can be measured furthermore accurately by injecting current of a small capacity. The harmonic characteristic in the power system can be measured extremely accurately in a small injection capacity and the measuring range can be enlarged furthermore.

PREFERRED EMBODIMENTS OF THE INVENTION

A first embodiment of the invention will be discussed with reference to FIG. 1 to FIG. 5.

First Embodiment

Figure 1:
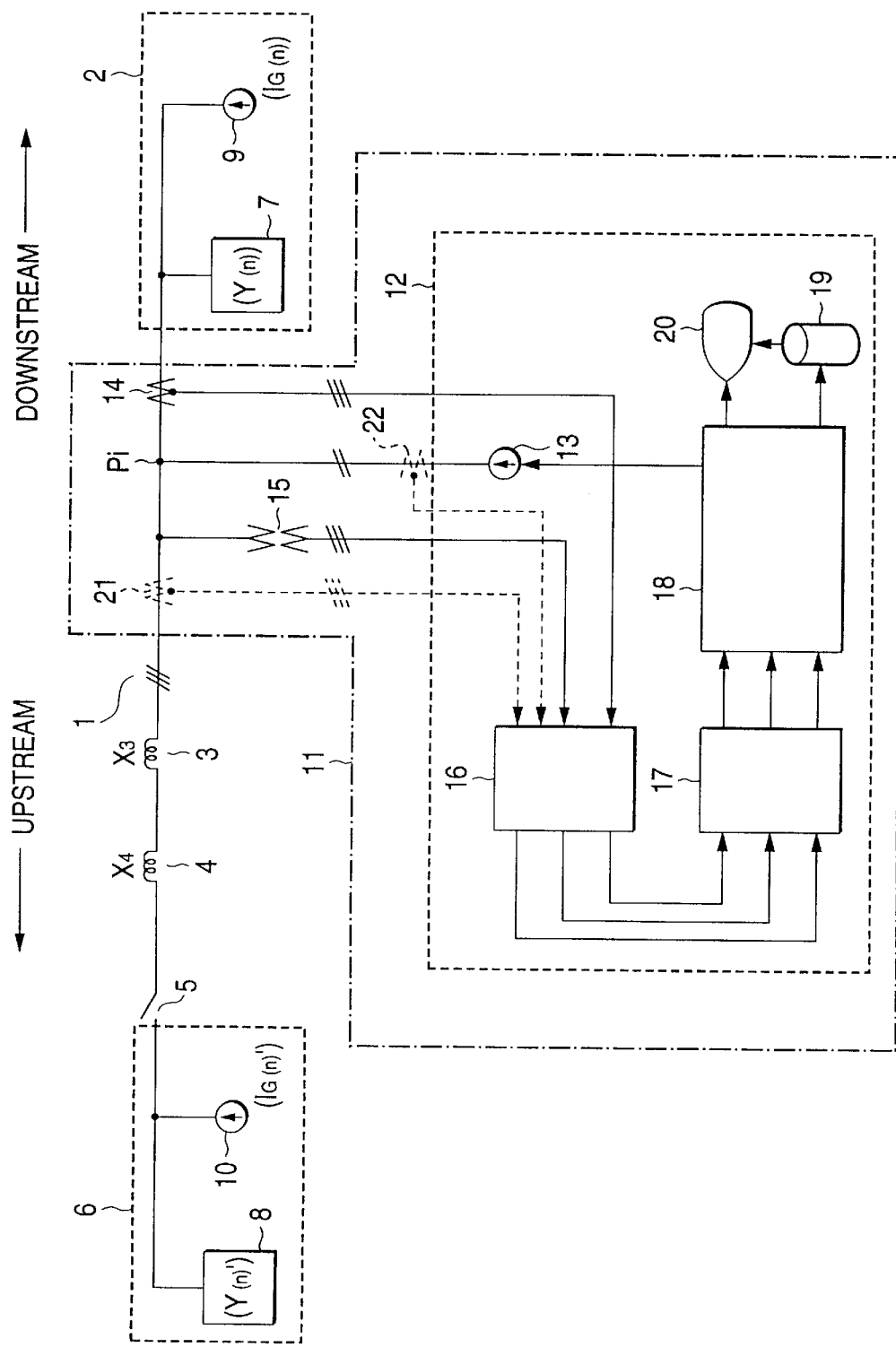
FIG. 1 is a circuit block diagram of a first embodiment of the invention.

FIG. 1 shows a three-phase power system 1 on which measurement is to be made. This power system 1 is a three-phase power distribution system not grounded, for example.

To measure a harmonic characteristic on the load side containing a capacitor facility in the power system 1, a injection point Pi of single-phase current at two frequencies fα and fβ is set at a position upstream from the connection point of the capacitor facility.

By the way, the n-order (nth) harmonic of the frequency n·fs of an integral multiple of the system fundamental wave frequency fs (n is an integer of 1, 2, . . . ) exists in the power system 1 and for the harmonic, a downstream equivalent circuit 2 is connected on the downstream side (load side) at the right of the figure viewed from the injection point Pi and an upstream equivalent circuit 6 is connected via transformer impedance 3 of a bank transformer in a transforming station, an upstream line impedance 4, and a circuit breaker 5, for example, on the upstream side at the left.

If the equivalent circuit 2, 6 is an admittance circuit represented by the Norton theorem, it can be assumed to be a parallel circuit of admittance 7, 8 and a current source 9, 10.

Each of the impedances 3 and 4 and the admittances 7 and 8 is three phases and is represented in terms of value viewed from the injection point Pi.

Particularly, an actual current source does not exist as the downstream current source 9, which is formed equivalently because of current distortion, etc., caused by load.

Further, values of X3 and X4 of impedances 3 and 4 are previously grasped from the line characteristic, etc., of the power system 1 and are already known.

When a predetermined harmonic in the power system 1, such as the fifth harmonic (n=5), is adopted as the targeted harmonic of a measurement object and an ever-changing time constant of the downstream equivalent circuit 2 relative to the harmonic is found for measuring the harmonic characteristic, a current injecting device 13 of single phase output provided in a injecting and measuring section 12 of a harmonic characteristic measuring apparatus 11 is connected to the injection point Pi.

A three-phase current transformer 14 for a measuring apparatus of current of each phase (phase current) in the power system 1 and a three-phase transformer 15 for a measuring apparatus of voltage of each phase (phase voltage) in the power system 1 are placed in the proximity of the injection point Pi in the power system 1.

Figure 2:
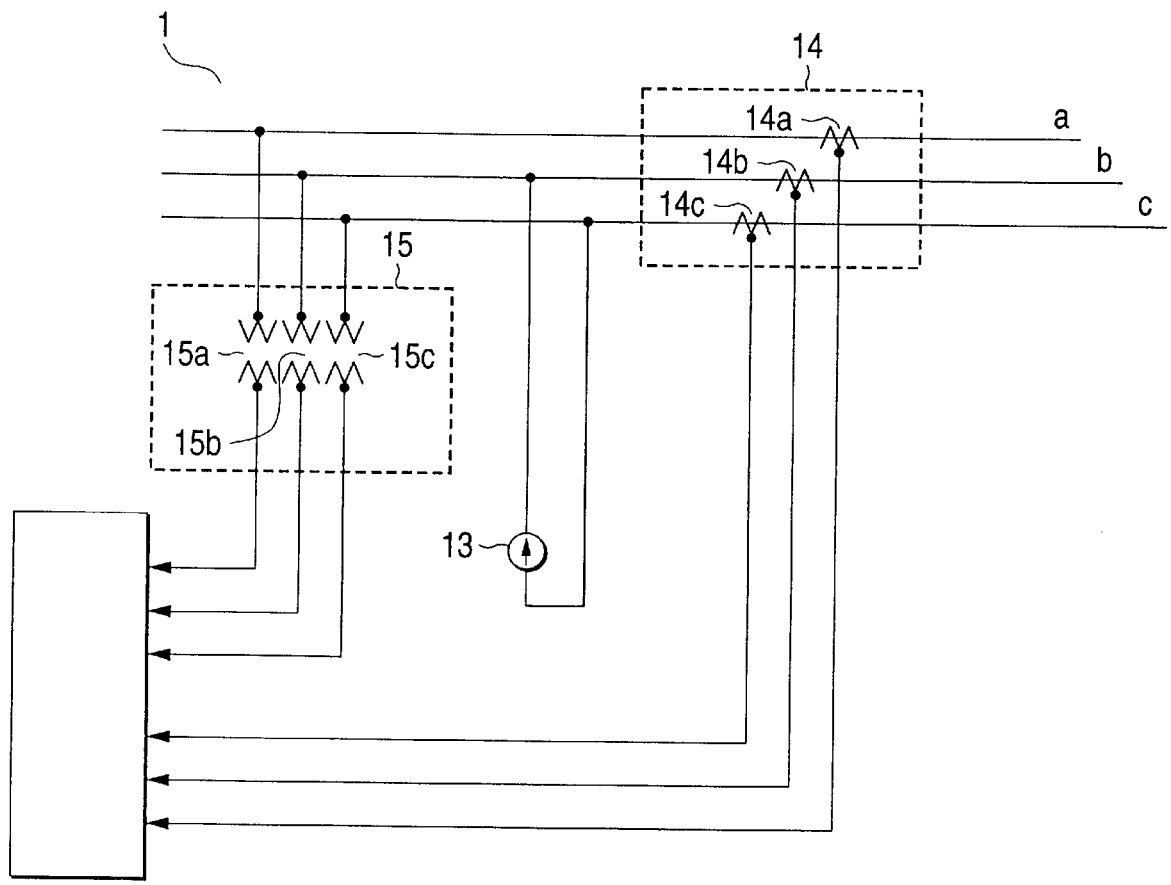
FIG. 2 is a detailed connection diagram of a part of the circuit in FIG. 1.

At this time, the current injecting device 13 made of an inverter of single phase output, etc., injections a single-phase current as an interline current between any two phases in the power system 1, such as a phase and b phase, specifically as shown in FIG. 2.

The injected current is an interharmonic current variably controlled alternatively to two frequencies fα and fβ of non-integral multiples of the system fundamental wave frequency fs (fα<n·fs<fβ) sandwiching the targeted harmonic at the measuring time.

A current measurement signal of each phase of the three-phase current transformer 14 and a voltage measurement signal of each phase of the three-phase transformer 15 are converted into current and voltage measurement data of each phase by an A/D converter 16 in the injecting and measuring section 12 and the measurement data is supplied to a signal processor 17 at the following stage, which then detects current and voltage at the frequency fα, fβ of each phase by carrying out a digital frequency analysis such as an FFT analysis.

Further, the signal processor 17 outputs the detection result to an arithmetic processing unit 18 at the following stage, which then calculates positive-phase-sequence and negative-phase-sequence admittances for the targeted harmonic, measures the characteristic of the power system 1 for the targeted harmonic, stores the measurement result in a storage section 19, and also displays the measurement result on a monitor of a display section 20.

The arithmetic processing unit 18 also comprises & injection control function of the current injecting device 13.

Next, a specific measuring method in FIG. 1 will be discussed.

First, the downstream side from the injection point Pi in the power system (actual system) relative to the current at the frequency fα, fβ can be assumed to be an equivalent circuit of admittance only because the frequency components do not exist in the actual system.

Figure 3:
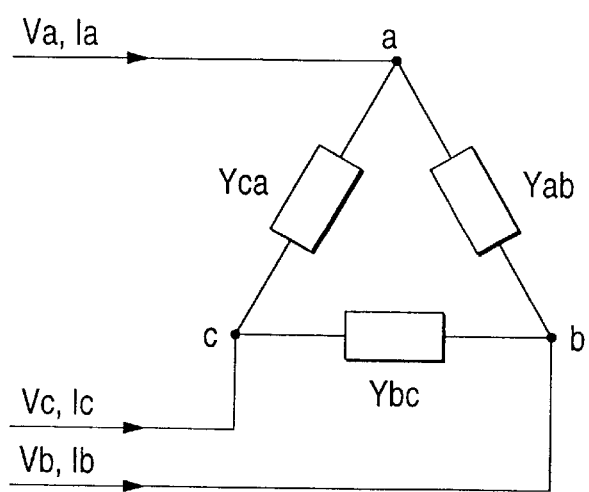
FIG. 3 is a Δ connection equivalent circuit diagram for interharmonic current on the load side of a injection point in FIG. 1.

Assume that the equivalent circuit is general Δ three-phase unbalanced load (admittance) Yab, Ybc, Yca and that currents (line currents) and voltages (line voltages) of a, b, and c phases based on current injecting at the frequency fα, fβ are Ia, Ib, and Ic and Va, Vb, and Vc, as shown in FIG. 3.

Assume that when they Are disassembled into symmetric components, zero-phase-sequence components are Y0, I0, and V0, positive-phase-sequence components are Y1, I1, and V1, and the negative-phase-sequence components are Y2, I2, and V2.

At this time, the line voltages Va, Vb, and Vc are expressed in the following expression in Expression 1:

$$\begin{pmatrix} V_a \\ V_b \\ V_c \end{pmatrix} = \begin{pmatrix} 1 & 1 & 1 \\ 1 & A^2 & A \\ 1 & A & A^2 \end{pmatrix} \begin{pmatrix} V_0 \\ V_1 \\ V_2 \end{pmatrix} \qquad (1)$$

where A is a constant of A=exp (j·(2π/3)).

The line currents Ia, Ib, and Ic are expressed in the following expression in Expression 2:

$$\begin{pmatrix} I_a \\ I_b \\ I_c \end{pmatrix} = \begin{pmatrix} Y_{ab} & V_{ab} \\ Y_{bc} & V_{bc} \\ Y_{ca} & V_{ca} \end{pmatrix} - \begin{pmatrix} Y_{ca} & V_{ca} \\ Y_{ab} & V_{ab} \\ Y_{bc} & V_{bc} \end{pmatrix} \qquad (2)$$

The interline voltages Vab, Vbc, and Vca in Expression 2 are expressed in the following expression in Expression 3:

$$\begin{pmatrix} V_{ab} \\ V_{bc} \\ V_{ca} \end{pmatrix} = \begin{pmatrix} V_a \\ V_b \\ V_c \end{pmatrix} - \begin{pmatrix} V_b \\ V_c \\ V_a \end{pmatrix} = \begin{pmatrix} 0 & 1-A^2 & 1-A \\ 0 & A^2-A & A-A^2 \\ 0 & A-1 & A^2-1 \end{pmatrix} \begin{pmatrix} V_0 \\ V_1 \\ V_2 \end{pmatrix} \qquad (3)$$

Further, if the line currents Ia, Ib, and Ic are disassembled into symmetric components, the positive-phase-sequence components become 0 in an ungrounded system such as a power distribution system. Thus, they are expressed in the following expression in Expression 4:

$$\begin{pmatrix} I_0 \\ I_1 \\ I_2 \end{pmatrix} = \frac{1}{3} \begin{pmatrix} 1 & 1 & 1 \\ 1 & A & A^2 \\ 1 & A^2 & A \end{pmatrix} \begin{pmatrix} I_a \\ I_b \\ I_c \end{pmatrix} = \begin{pmatrix} 0 & 0 & 0 \\ 0 & 3Y_0 & -Y_2 \\ 0 & -Y_1 & 3Y_0 \end{pmatrix} \begin{pmatrix} V_0 \\ V_1 \\ V_2 \end{pmatrix} \quad (4)$$

The zero-phase-sequence, positive-phase-sequence, and negative-phase-sequence admittances Y0, Y1, and Y2 in Expression 4 are expressed in the following expression in Expression 5:

$$\begin{pmatrix} Y_0 \\ Y_1 \\ Y_2 \end{pmatrix} = \frac{1}{3} \begin{pmatrix} 1 & 1 & 1 \\ 1 & A & A^2 \\ 1 & A^2 & A \end{pmatrix} \begin{pmatrix} Y_{bc} \\ Y_{ca} \\ Y_{ab} \end{pmatrix} \quad (5)$$

Based on Expressions 4 and 5, the line currents Ia, Ib, and Ic are expressed in the following expression in Expression 6 if the admittances Y0, Y1, and Y2 are used:

$$\begin{pmatrix} I_a \\ I_b \\ I_c \end{pmatrix} = \begin{pmatrix} 1 & 1 & 1 \\ 1 & A^2 & A \\ 1 & A & A^2 \end{pmatrix} \begin{pmatrix} I_0 \\ I_1 \\ I_2 \end{pmatrix}$$

$$= \begin{pmatrix} 1 & 1 & 1 \\ 1 & A^2 & A \\ 1 & A & A^2 \end{pmatrix} \begin{pmatrix} 0 & 0 & 0 \\ 0 & 3Y_0 & -Y_2 \\ 0 & -Y_1 & 3Y_0 \end{pmatrix} \begin{pmatrix} 1 & 1 & 1 \\ 1 & A^2 & A \\ 1 & A & A^2 \end{pmatrix}^{-1} \begin{pmatrix} V_a \\ V_b \\ V_c \end{pmatrix}$$

$$= \frac{1}{3} \begin{pmatrix} 1 & 1 & 1 \\ 1 & A^2 & A \\ 1 & A & A^2 \end{pmatrix} \begin{pmatrix} 0 & 0 & 0 \\ 3Y_0 - Y_2 & 3A^2Y_0 - AY_2 & 3AY_0 - A^2Y_2 \\ 3Y_0 - Y_1 & 3AY_0 - A^2Y_1 & 3A^2Y_0 - AY_1 \end{pmatrix} \begin{pmatrix} V_a \\ V_b \\ V_c \end{pmatrix}$$

$$= \frac{1}{3} \begin{pmatrix} 6Y_0 - Y_1 - Y_2 & -3Y_0 - A^2Y_1 - AY_2 & -3Y_0 - AY_1 - A^2Y_2 \\ -3Y_0 - AY_1 - A^2Y_0 & -3Y_0 - Y_1 - Y_2 & 6Y_0 - A^2Y_1 - AY_2 \\ -3Y_0 - A^2Y_1 - AY_2 & 6Y_0 - AY_1 - A^2Y_2 & -3Y_0 - Y_1 - Y_2 \end{pmatrix} \begin{pmatrix} V_a \\ V_b \\ V_c \end{pmatrix} \quad (6)$$

Next, as seen from Expression 4, the relation in the following expression in Expression 7 exists among the current, voltage, and admittance expressed by the symmetric components for the three-phase unbalanced load in FIG. 3:

$$\begin{pmatrix} I_1 \\ I_2 \end{pmatrix} = \begin{pmatrix} 3Y_0 & -Y_2 \\ -Y_1 & 3Y_0 \end{pmatrix} \begin{pmatrix} V_1 \\ V_2 \end{pmatrix} \quad (7)$$

For simplicity, assume that the admittance matrix on the right side of Expression 7 is an admittance matrix with diagonal terms as admittances Y11 and Y22 and non-diagonal terms as admittances Y12 and Y21 as shown in the following expression in Expression 8:

$$\begin{pmatrix} 3Y_0 & -Y_2 \\ -Y_1 & 3Y_0 \end{pmatrix} = \begin{pmatrix} Y_{11} & Y_{12} \\ Y_{21} & Y_{22} \end{pmatrix} \quad (8)$$

For the admittances Y11, Y12, Y21 and Y22 in Expression 8, if a three-phase injecting method of injecting positive-phase-sequence and negative-phase-sequence currents at the frequency fα, fβ into the three phases in the power system 1 and measuring is used, the admittances Y11 and Y21 are found from calculation of Y11=I1/V1 and Y21=I2/V2 and the admittances Y12 and Y22 are found from calculation of Y12=I1/V2 and Y22=I2/V2 based on the positive-phase-sequence current I1, the positive-phase-sequence voltage V1, the negative-phase-sequence current I2, and the negative-phase-sequence voltage V2.

If the admittances Y11, Y12, Y21, and Y22 are found, the admittances Y0, Y1, and Y2 in Expressions 4 and 7 can be determined.

The reason is as follows: The admittance in the power system 1 viewed from the injection point Pi in FIG. 1 becomes parallel admittance of the upstream admittance and the downstream admittance. At this time, the upstream transformer impedance 3 is sufficiently small, thus independently of the downstream admittance, the admittance in the power system 1 viewed from the injection point Pi is determined almost by the transformer impedance 3, namely, the reactance component (L component) of the bank transformer and the positive-phase-sequence voltage V1 occurs by injecting the positive-phase-sequence current I1 and the negative-phase-sequence voltage V2 occurs by injecting the negative-phase-sequence current I2.

If the admittances Y0, Y1, and Y2 in Expressions 4 and 7 can be determined for the interharmonic current at the frequency fα, fβ, in the simplest way, the average values (intermediate values) of the admittances Y0, Y1, and Y2 for the frequency fα, fβ can be found as the zero-phase-sequence, positive-phase-sequence, and negative-phase-sequence admittances for the targeted harmonic and the harmonic characteristic can be measured because the frequency of the targeted harmonic, n·fs, is an intermediate frequency of the frequency fα, fβ.

Next, if single-phase current at the frequency fα, fβ is injected into the injection point Pi from the current injecting device 13, assuming that the injected current is Iinj, the injected current Iinj is injected only between the a and b phases, for example.

Figure 4A:
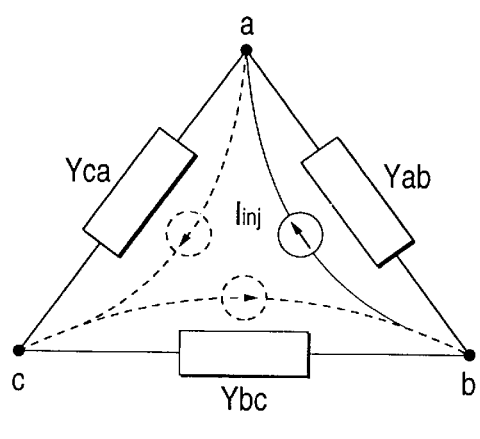
FIG. 4A is an equivalent circuit diagram in a state in which single-phase current is injected into the equivalent circuit in FIG. 3.

At this time, the current injecting device 13 can be assumed to be a three-phase Δ connection current source in FIG. 4A for injecting the injected current Iinj between the a and b phases and no injected current between the b and c phases or between the c and a phases.

Figure 4B:
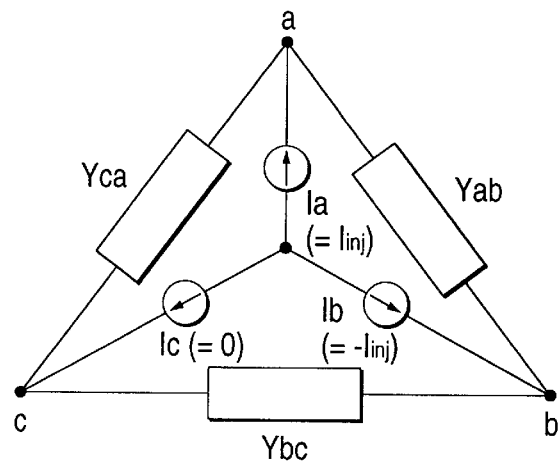
FIG. 4B is an equivalent circuit diagram in a state of ΔY conversion of a current source in the equivalent circuit in FIG. 4A.

The Δ connection current source can be converted into a Y connection three-phase current source of currents Ia, Ib, and Ic shown in FIG. 4B by executing Δ y conversion, where Ia=Iinj, Ib=Iinj, and Ic=0.

Further, if the single-phase injected current Iinj is disassembled into symmetric components based on Expression 4, zero-phase-sequence current Iinj0, positive-phase-sequence current Iinj1, and negative-phase-sequence current Iinj2 are expressed in the following three expressions in Expression 9:

$$Iinj_0 = \frac{1}{3} \cdot (Ia + Ib + Ic) = 0 \qquad (9)$$

$$Iinj_1 = \frac{1}{3} \cdot (Ia + A \cdot Ib + A^2 \cdot Ic)$$

$$= \frac{1}{2} \cdot \left(1 + j\frac{1}{\sqrt{3}}\right) \cdot Iinj$$

$$Iinj_2 = \frac{1}{3} \cdot (Ia + A^2 \cdot Ib + A \cdot Ic)$$

$$= \frac{1}{2} \cdot \left(1 - j\frac{1}{\sqrt{3}}\right) \cdot Iinj$$

Figure 5:
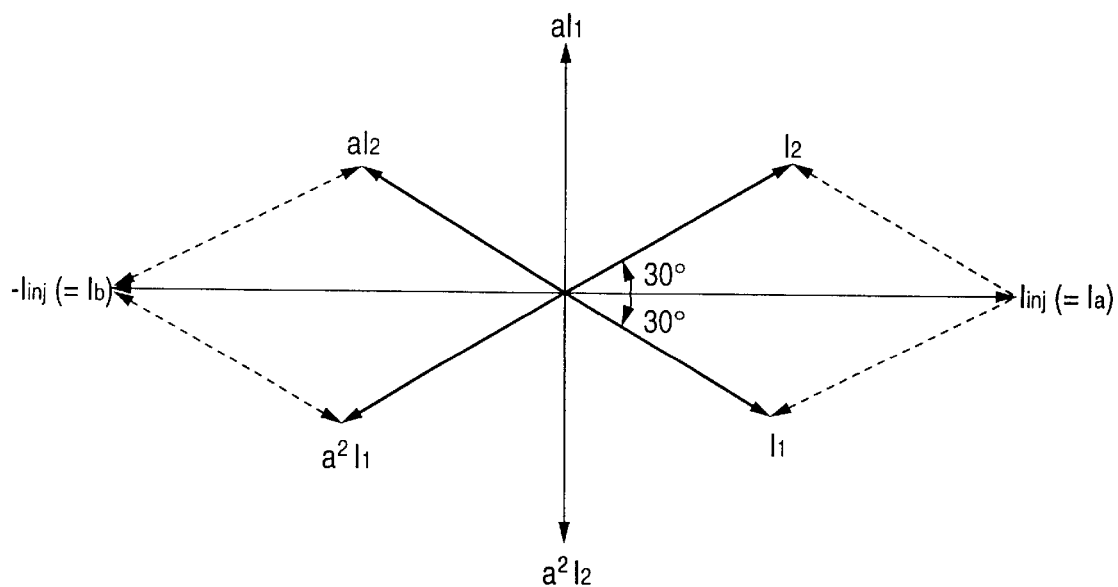
FIG. 5 is a vector diagram to describe disassembling of single-phase injection current in FIG. 1 into three-phase symmetric components.

As also seen from the three expressions in Expression 9, if the single-phase current Iinj is injected into the power system 1, the positive-phase-sequence current I1 (=Iinj1) and the negative-phase-sequence current I2 (=Iinj2) are equal in size and the phase difference therebetween becomes 60 degrees [=2×arg{1+j(⅓)}], as shown on current vectors in FIG. 5.

Iinj (=Ia) and −Iinj (=Ib) in FIG. 5 denote the injected current into the a phase and its return current, the injected current into the b phase respectively.

The relation between the positive-phase-sequence voltage V1 and the negative-phase-sequence voltage V2 occurring based on injecting of the single-phase current also becomes almost similar to that between the positive-phase-sequence current Iinj1 and the negative-phase-sequence current Iinj2 described above.

The reason is that when the single-phase current is injected into the injection point Pi in FIG. 1, the admittance in the power system 1 viewed from the injection point Pi is also determined almost by the upstream bank transformer admittance independently of the load admittance.

By the way, unlike the three-phase current, the single-phase current cannot be injected into each phase separately, thus the admittances Y11, Y12, Y21, and Y22 in Expression 8 cannot be found separately.

On the other hand, the relation between voltage (system voltage) and current (load current) in a three-phase power system generally is expressed in the following two expressions in Expression 10 for the positive-phase-sequence current I1 and the negative-phase-sequence current I2 assuming that the load admittances are the admittances Y11, Y12, Y21, and Y22 in Expression 8:

$$I_1 = Y_{11} \cdot V_1 + Y_{12} \cdot V_2 = (Y_{11} + Y_{12} \cdot (V_2/V_1)) \cdot V_1$$

$$I_2 = Y_{22} \cdot V_2 + Y_{21} \cdot V_1 = (Y_{22} + Y_{21} \cdot (V_1/V_2)) \cdot V_2 \qquad (10)$$

Since the relation between the positive-phase sequence and the negative-phase sequence in single-phase injecting becomes similar to that in three-phase injecting as described above, it turned out that the positive-phase-sequence admittance Y1 and the negative-phase-sequence admittance Y2 in single-phase injecting can be estimated from calculation of the following expressions in Expression 11 and measured:

$$Y_1 = \frac{I_1}{V_1} = Y_{11} + Y_{12} \cdot (V_2/V_1) \qquad (11)$$

$$Y_2 = \frac{I_2}{V_2} = Y_{22} + Y_{21} \cdot (V_2/V_1)$$

The reason is as follows:

First, if imbalance among the three phases of a system load is large, the admittances Y12 and Y21 in Expression 11 increase and calculation errors of the admittances Y1 and Y2 according to Expression 11 become large.

The reason is that if the system load is in a complete balance state, asymmetric components become zero and the admittances Y1 and Y2 can be calculated precisely with no error in calculation of Expression 11; if the system load is not in a complete balance state, since the admittances Y1 and Y2 of the three-phase system (three-phase circuit) are essentially matrix amounts, an error occurs and grows as the system load imbalance becomes large.

However, in a power distribution system, etc., if a general load consisting of a resistance component (R component) and reactance (L component) is a little large, the asymmetric component (admittance Y12, Y21) is sufficiently small as compared with the symmetric component (admittance Y11, Y22) and if the admittances Y1 and Y2 are calculated and determined from the calculation of Expression 11, a calculation error is small.

The reason is as follows: In the power distribution system, a capacitor facility is contained in the admittance 7 and has a far larger capacity than the general load; the capacitor facility capacity for the fifth harmonic with n=5 is about five times that of the general load and the system load capacity is determined almost by the capacitor facility. Moreover, the capacitor facility normally is set to as to balance in an error within 5% and imbalance of the whole load side containing the capacitor facility is small.

Therefore, if the power system 1 is a power distribution system, etc., single-phase current at the frequency fα, fα is injected between the a and b phases in the power system 1, for example, and calculation of Y1=I1/V1 and Y2=I2/V2 in Expression 11 is executed based on measurement of 3-phase current and voltage at the frequency fα, fβ in the power system 1 at the time, whereby the positive-phase-sequence admittance Y1 and the negative-phase-sequence admittance Y2 for the frequency fα, fβ can be measured with the same degree of accuracy as in the case of three-phase injecting.

A similar result is produced if the single-phase current is injected between the b and c phases or the c and a phases instead of the a and b phases.

Since it is generally considered that the system upstream from the power distribution system is smaller in load imbalance than the power distribution system, more accurate measurement can be executed by injecting the single-phase current.

The description made so far assumes that based on the three-phase unbalanced circuit in FIG. 3, the admittances Y11 and Y22 in the diagonal terms of Expression 8 satisfy Y11=Y22=3Y0 and equal in size.

This means that the positive-phase-sequence admittance and the negative-phase-sequence admittance equal. Although it does not strictly hold, the difference between the positive-phase-sequence admittance and the negative-phase-sequence admittance is at most about three times even in an inverter where the difference is considered to be large according to actual measurement; if both the admittances are considered to be equal, there is no problem in practical use.

Thus, it is not wrong to consider that in the symmetric component matrix of the admittances in Expression 8, the diagonal terms are sufficiently small with respect to the non-diagonal terms and the admittance Y and Y2 calculation error is small if $Y11 \neq Y22$.

Thus, it was turned out that to injection the single-phase currents at the frequencies fα and fβ into the power system 1 of a power distribution system, etc., and measure the admittances Y1 and Y2 for the frequencies, if (1) the capacitor facility capacity (SC capacity) is small, (2) load is heavy, and (3) the load is unbalanced in the power system 1, an admittance measurement error occurs, but when these three conditions are not satisfied, measurement can be made with accuracy equal to that in the case of three-phase injecting.

When a power state satisfying the conditions (1), (2), and (3) is entered, normally if the capacitor facility capacity (SC capacity) is increased and an admittance measurement error becomes slightly large, enlarged resonance does not occur and no problem is introduced in practical use to measure the harmonic characteristic.

Therefore, to injection the single-phase currents at the frequencies fα and fβ into the power system 1 and measure the harmonic characteristic, if the admittances Y1 and Y2 shown in the two expressions in Expression 11 are found, the admittance characteristic in the power system 1 for the injected currents at the frequencies fα and fβ can be found with practical accuracy.

From the admittance characteristic, the admittance characteristic in the power system 1 for the intermediate targeted harmonics of the frequencies fα and fβ can be found and measured.

To measure the harmonic characteristic downstream from the injection point Pi, a single-phase current at the frequency fα and that at fβ are separately injected between the a and b phases in the power system 1, for example, as interharmonic current from the current injecting device 13 as described above and the three-phase current flowing downstream from the injection point Pi in the power system 1 and the three-phase voltage in the power system 1 are measured with the current transformer 14 and the transformer 15.

Further, the signal processor 17 detects the three-phase current Ia, Ib, Ic and the three-phase voltage Va, Vb, Vc at the frequencies fα and fβ in the power system 1 based on the secondary measurement signals of the current transformer 14 and the transformer 15.

The arithmetic processing unit 18 disassembles the three-phase current Ia, Ib, Ic and the three-phase voltage Va, Vb, Vc into symmetric components considering that the zero-phase-sequence current I0 and the zero-phase-sequence voltage V0 become zero and finds the positive-phase-sequence current I1, the positive-phase-sequence voltage V1, the negative-phase-sequence current I2, and the positive-phase-sequence voltage V2 for each of the frequencies fα and fβ.

The positive-phase-sequence admittance Y1 and the negative-phase-sequence admittance Y2 on the load side of the injection point Pi based on injecting of interharmonic current at the frequencies fα and fβ are found by calculating the two expressions I1/V1 and I2/V2 in Expression 11, and the admittance characteristics for the frequencies fα and fβ on the load side from the injection point Pi in the power system 1 are found for determining the admittances of equivalent circuits.

At this time, the currents at the frequencies fα and fβ are currents at frequencies not existing in the power system 1, thus if the injected power amount of the current injecting device 13 is minute, the admittance characteristics for the frequencies fα and fβ can be found for determining the admittances of the equivalent circuits without receiving the harmonic effect in the power system 1.

Further, since the targeted harmonic frequency n·fs is fα<n·fs<fβ, the positive-phase-sequence admittance and the negative-phase-sequence admittance for the targeted harmonic can be found by executing interpolation operation from the positive-phase-sequence admittance and the negative-phase-sequence admittance for the two frequencies fα and fβ.

Assuming that the positive-phase-sequence admittance and the negative-phase-sequence admittance found for the frequency fα are Y1α and Y2α, that those found for the frequency fβ are Y1β and Y2β, and that those for the targeted harmonic are Y1n and Y2n, the arithmetic processing unit 18 finds the positive-phase-sequence admittance and the negative-phase-sequence admittance for the targeted harmonic, Y1n and Y2n, by performing various types of average calculation processing of simple mean, weighted mean, etc., of the positive-phase-sequence admittances Y1α and Y1β and the negative-phase-sequence admittances Y2α and Y2β, determines the admittance 7 of the equivalent circuit 2 in FIG. 1, and measures the harmonic characteristic for the targeted harmonic downstream from the injection point Pi.

At this time, the admittances Y1α, Y1β, Y2α, and Y2β can be found precisely without receiving the harmonic effect in the power system 1, thus the admittance 7 for the targeted harmonic can also be found without receiving the harmonic effect; the harmonic characteristic can be measured with high accuracy.

By the way, if a current transformer 21 indicated by the dashed line in FIG. 1 is provided for measuring the three-phase currents at the frequencies fα and fβ flowing upstream in the power system 1, since the impedances 3 and 4 are already known, the admittance 8 of the equivalent circuit 6 for the targeted harmonic can be determined and the harmonic characteristic for the targeted harmonic upstream from the injection point Pi can be measured in a similar manner to that as described above based on the detection signals of a current transformer 22 and the transformer 15.

If a current transformer 22 indicated by the dashed line in FIG. 1 is provided for detecting single-phase injected current and three-phase currents at the frequencies fα and fβ flowing downstream and upstream from the injection point Pi based on the detection result of either of the current transformers 14 and 21 and that of the current transformer 22, only either of the current transformers 14 and 22 is provided in the power system 1 and the harmonic characteristics for the targeted harmonics downstream and upstream from the injection point Pi can be measured.

Next, in the embodiment, for example, to measure the harmonic characteristic on the load side of the injection point Pi, the admittance 7 for the targeted harmonic is found and determined, then the current source 9 for the targeted harmonic is found in order to find the equivalent circuit 2 more completely.

That is, when the admittance 7 for the targeted harmonic is found, the current injecting device 13 stops injecting current and downstream targeted harmonic current (harmonic current) and voltage (harmonic voltage) in the power system 1 are actually measured with the current transformer 14 and the transformer 15.

Assuming that the three-phase harmonic current and voltage of the targeted harmonic actually measured are I(n) and V(n) and that three-phase representations of the admittance 7 and the current source 9 of the equivalent circuit 2 are Y(n) and IG(n), the following expression in Expression 12 holds for the downstream side of the injection point Pi:

$$I_{G(n)} = -I_{(n)} + V_{(n)} \cdot Y_{(n)} \tag{12}$$

Therefore, the arithmetic processing unit 18 finds the value IG(n) of the current source 9 from calculation of the expression in Expression 12 based on the actually measured harmonic current I(n) and harmonic voltage V(n) and the determined admittance 7 value Y(n), and completely finds and determines the equivalent circuit 2 for the targeted harmonic, To more completely find and determine the equivalent circuit 6 upstream from the injection point Pi, for example, harmonic current I(n)' and harmonic voltage V(n) for the targeted harmonic upstream in the power system 1 are actually measured with the current transformer 21 and the transformer 15 and value IG(n)' of the current source 10 of the equivalent circuit 6 is found from calculation of the following expression in Expression 13 based on the actual measurement values and value Y(n)' of the admittance 8 of the equivalent circuit 6:

$$I_{G(n)}' = Y_{(n)}' \cdot (V_{(n)} - V_{3(n)} - V_{4(n)}) + I_{(n)}' \tag{13}$$

In Expression 13, V3(n) and V4(n) denote voltage drops of the impedances 3 and 4 based on flow of targeted harmonic current I(n)' and V3(n)=X3·I(n)' and V4(n)=X4·I(n)'.

The determined circuit constants Y(n), Y(n)', IG(n), IG(n)', etc., of the equivalent circuits 2 and 6 are stored in the storage section 19 and are also displayed on a screen of the display section 20 in the form of an equivalent circuit diagram, for example.

Further, to decrease harmonic as the system is switched, etc., each measurement described above is repeated to keep track of the most recent state of the equivalent circuits 2 and 6, and the constant of the filter facility contained in the equivalent circuit 2 is set to an optimum value from the result, etc.

Therefore, single-phase currents are injected as currents at the frequencies fα and fβ, the harmonic characteristic in the power system 1 is measured with accuracy, and the harmonic can be decreased, etc., based on the measurement result.

Assuming that single-phase current injected between the a and b phases in the power system 1, for example, from the current injecting device 13 is Iab and that three-phase current provided by executing ΔY conversion of the current Iab is Ia, Ib, Ic, Ia=Iab, Ib=−Iab, and Ic=0. When the three-phase current is disassembled into symmetric components, for example, the zero-phase-sequence current I0 and the positive-phase-sequence current I1 become as shown in the following two expressions in Expression 14:

$$I_0 = \tfrac{1}{3} \cdot (Ia + Ib + Ic) = 0$$

$$I_1 = \tfrac{1}{3} \cdot (Ia + A \cdot Ib + A^2 \cdot Ic) = \tfrac{1}{2} \cdot (1 + j(1/\sqrt{3})) \cdot Iab \tag{14}$$

At this time, the zero-phase-sequence current I0 is zero and the absolute value of the positive-phase-sequence current I1 become ⅓ (≈0.57) times that of Iab; ditto for the negative-phase-sequence current I2.

Thus, as compared with the case of three-phase injecting of injecting a phase current of the same capacity as the current Iab into each phase in the power system 1, the current injecting device 13 results in a capacity of ⅓ and can be reduced in size and weight.

By the way, in the embodiment, the equivalent circuit 2, 6 is a parallel circuit of the admittance 7, 8 and the current source 9, 10 and the admittance and current source for the targeted harmonic are found, but the equivalent circuit 2, 6 may be a series circuit of impedance and a voltage source and the impedance and voltage source for the targeted harmonic may be found, of course.

In this case, based on single-phase current injecting at the frequency fα, fβ, positive-phase-sequence impedance Z1 (=V1/I1) and negative-phase-sequence impedance Z2 (=V2/I2) for the frequency fα, fβ are found and from their interpolation operation, the positive-phase-sequence impedance and negative-phase-sequence impedance for the targeted harmonic may be found.

If only the positive-phase-sequence or negative-phase-sequence admittance or impedance for the targeted harmonic is required, etc., only positive-phase-sequence admittance Y1 or negative-phase-sequence admittance Y2 or positive-phase-sequence impedance Z1 or negative-phase-sequence impedance Z2 for the frequency fα, fβ is found and from their interpolation operation, only the positive-phase-sequence or negative-phase-sequence admittance or positive-phase-sequence or negative-phase-sequence impedance for the targeted harmonic may be found.

The injecting and measuring section 12 containing the current injecting device 13 may be of any configuration; for example, the current injecting device 13 need not be an inverter, needless to say.

First, single-phase currents are injected between two phases of the three-phase power system as the currents of the interharmonics of the two frequencies fα and fβ, whereby the positive-phase-sequence and negative-phase-sequence admittances or the positive-phase-sequence and negative-phase-sequence impedances for the targeted harmonic in the system are found.

Particularly in an ungrounded system such as a power distribution system, zero-phase-sequence components need not be considered and the harmonic characteristic can be grasped according to the positive-phase-sequence and negative-phase-sequence components.

At this time, the currents at the frequencies fα and fβ do not exist in the power system, thus the admittances Y1 and Y2 or the impedances Z1 and Z2 can be found with accuracy without receiving the harmonic effect in the system. Resultantly, the positive-phase-sequence and negative-phase-sequence admittances or impedances for the targeted harmonic can be found with accuracy and the harmonic characteristic can be measured with high accuracy.

Moreover, since single-phase current may be injected into the power system, the current injecting amount may be ⅓ that when three-phase current is injected and measuring can be performed by injecting current of an extremely small capacity as compared with the case where three-phase current is injected.

The positive-phase-sequence or negative-phase-sequence admittance or the positive-phase-sequence or negative-phase-sequence impedance for the targeted harmonic in the three-phase power system is found based on injecting of single-phase currents as the currents of the interharmonics of the two frequencies fα and fβ as in the invention as claimed in claim 1, and the harmonic characteristic can be measured with high accuracy.

Next, since the measuring apparatus comprises the current injecting device, the current transformers, the transformer, the signal processing means (signal processor), and the arithmetic processing means (arithmetic processing unit), it can be provided as a new harmonic characteristic measuring apparatus for measuring the harmonic characteristic for the targeted harmonic in the three-phase power system by the harmonic characteristic measuring method in the invention as claimed in claim 1 or 2. At the time, the current injecting device can have the capacity decreased to ⅓ that for injecting three-phase current and can be reduced in size and weight.

Second Embodiment

A second embodiment of the invention will be discussed with reference to FIG. 6 to FIG. 9.

Figure 6:
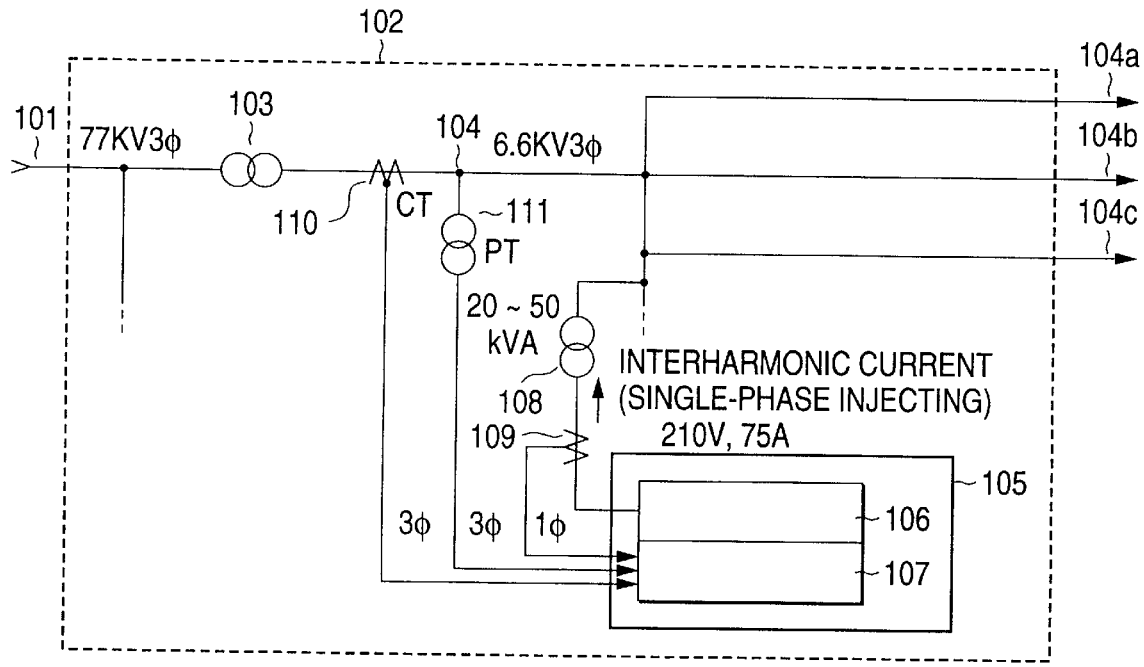
FIG. 6 is a single-line connection diagram of a second embodiment of the invention.

FIG. 6 is a single-line connection diagram for measuring in a transforming station for power distribution. A three-phase (3φ) power system consists of a 77-KV upstream system 101 and a 6.6-KV downstream system connected to the system 101 via a power distribution transformer 103 in a transforming station 102. The downstream system 104 branches into feeders 104a, 104b, 104c, . . . from the transforming station 102 for supplying power to facilities (load machines).

A harmonic measuring apparatus provided in the transforming station 102 comprises a injecting section 106 for injecting current and a measuring section 107.

The injecting section 106 is made up of components such as a single-phase inverter for power with output frequency variably set by a injection signal described later, is controlled so as to injection a single-phase (1φ) output current at a setup frequency into the power system or stop injecting the output current as a injection gate made up of a semiconductor switch, etc., at an output stage is opened or closed, and injections single-phase current of each interharmonic (210V, 75A), for example, into the downstream system 104 via a power transformer 108 in the station having a capacity of 20–50 KVA.

The single-phase injected current is measured with a single-phase measuring apparatus current transformer 109 placed between the injecting section 106 and the transformer 108 and current and voltage of each phase in the downstream system 104 are measured with a three-phase measuring apparatus current transformer 110 and measuring apparatus transformer 111.

The injecting section 106 monitors current, voltage, etc., at each point in the measuring apparatus 105 and executes self-diagnosis by computer processing. If any abnormal condition occurs, the injecting section 106 outputs an abnormal condition notification signal to the measuring section 107.

Figure 7:
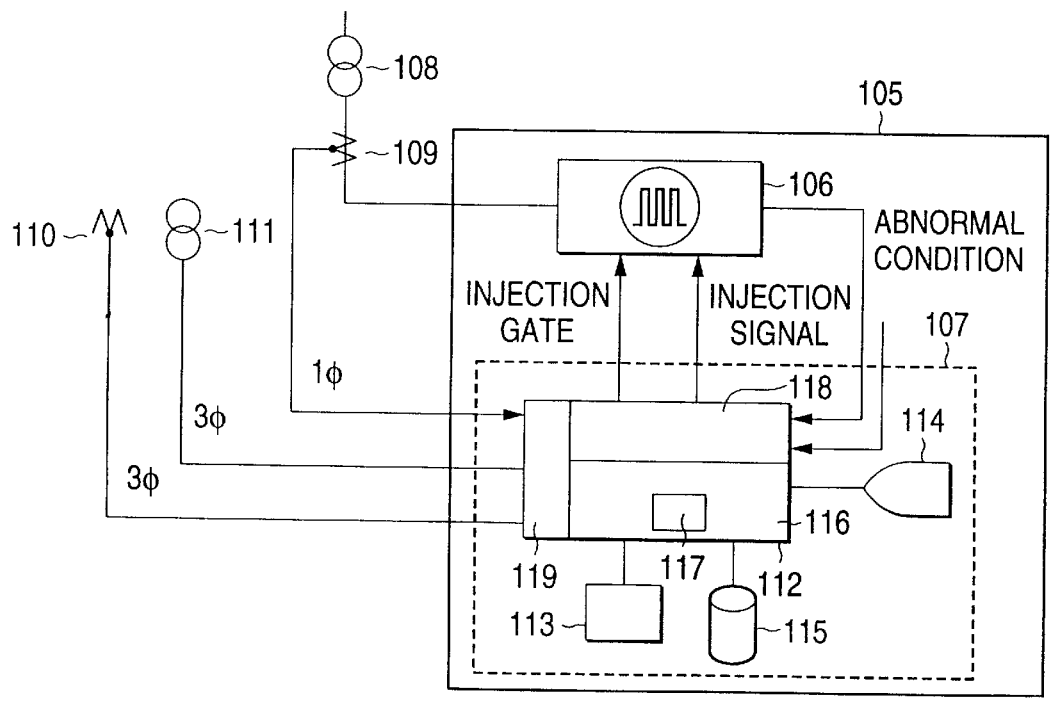
FIG. 7 is a detailed connection diagram of a part in FIG. 6.

As shown in FIG. 7, the measuring section 107 comprises an operation section 113 of a keyboard, a mouse, etc., a display section 114 of a CRT, etc., and a data storage section 115 of a hard disk drive, etc., connected to a main body 112 of a computer. It has a control function of injecting of the injecting section 106 and a measurement data collection function of measurement current with the current transformers 109 and 110 and measurement voltage with the transformer 111.

The main body 112 has a control processing section 116 made of a CPU (central processing section), etc., RAM (random access memory) 117 for forming work memory, etc., an input/output interface 118 for transferring a signal to and from the injecting section 106, and an A/D conversion section 119 for converting measurement current and measurement voltage into digital measurement data. The control processing section 116 executes a setup measurement program and comprises the following units (i) to (v):

(i) a unit for determining selection of one-time measurement of starting sequential injecting of current of each interharmonic according to a manual trigger and terminating the current injecting by executing once or continuous measurement of repeating sequential injecting of current of each interharmonic according to timing control;

(ii) a unit for forming a injection signal for controlling an output frequency, supplying the signal to the injection section 106, and varying output current of the injection section 106 to current of each interharmonic in sequence once or repeatedly in accordance with selection of one-time or continuous measurement;

(iii) a unit for forming a injection gate signal for commanding the injection gate to be opened or closed, supplying the signal to the injection section 106, and opening the injection gate for allowing the output current to be injected into the power system in a stable period until the injection signal changes to the next interharmonic current signal after the output current of the infection section 106 changes to current of each interharmonic;

(iv) a unit for collecting measurement data of measurement current and measurement voltage in the power system in the stable period; and (v) a unit for forcibly stopping injecting of the injection section 106 and allowing the protective operation to be performed preferentially when an abnormal condition occurs according to interrupt processing based on abnormal condition notification from the injecting section 106, abnormal condition detection in the power system, etc.

Figure 8:
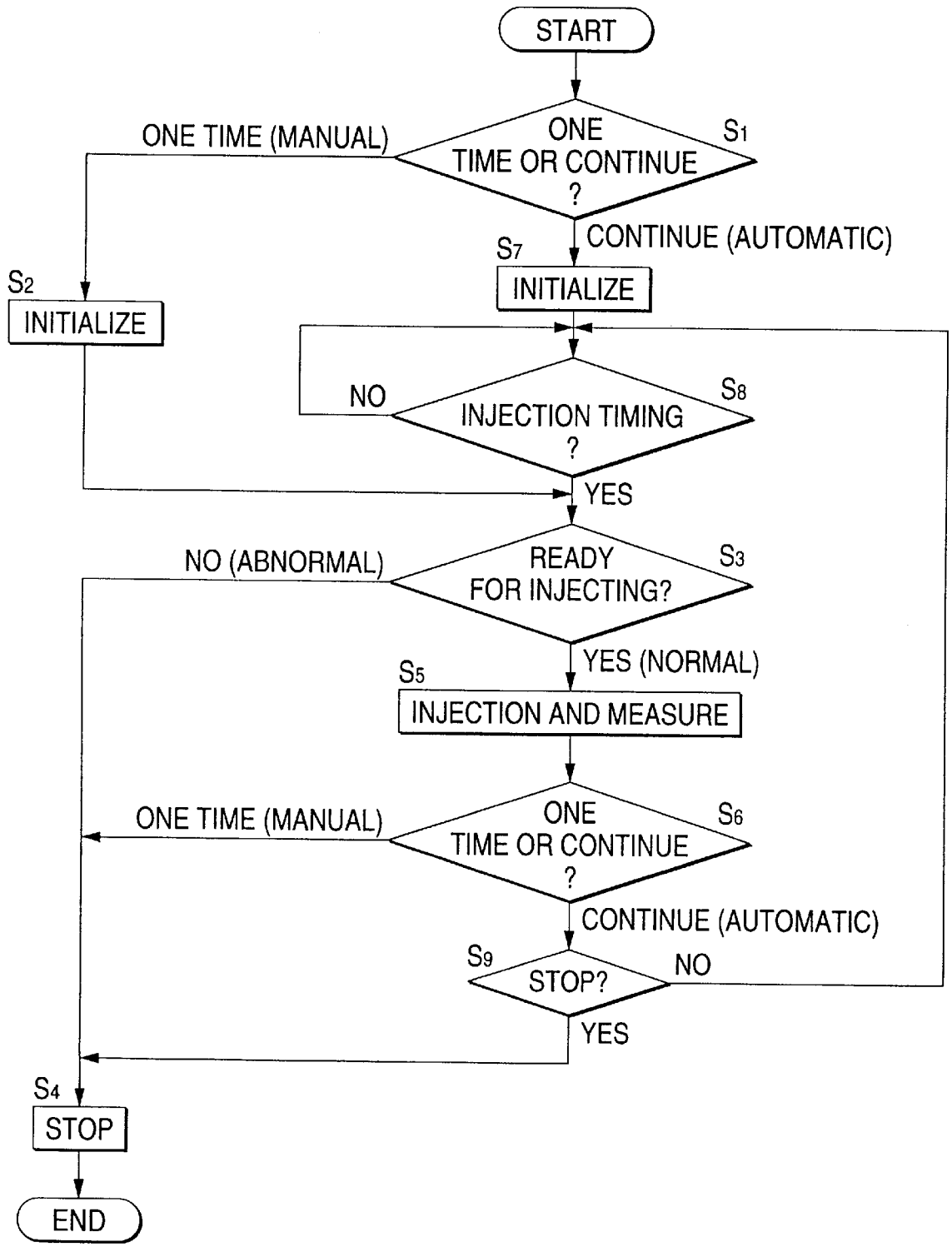
FIG. 8 is a flowchart to describe the operation in FIG. 6.

The measuring section 107 operates as shown on a flowchart of FIG. 8 based on the units (i) to (v).

First, when power is turned on, etc., the control processing section 116 executes the measurement program. Then, for example, the display section 141 displays a selection screen of one-time measurement (manual measurement) or continuous measurement (automatic measurement).

When the operator selects either measurement with the mouse of the operation section 113, the measurement mode is determined to be selected at step S1. When one-time measurement is selected, this-selection is used as a manual operation trigger and control goes to step S2 for initialization.

In the initialization, the injecting section 106 and the measuring section 107 are initialized and injection frequencies are initialized based on interharmonics set by the operator through the keyboard, etc.

Assuming that the harmonics to be measured are five-order and seven-order harmonics, the interharmonics are set as follows:

A plurality of interharmonics are set above and below the harmonics to be measured and measurement is executed. Thus, for the five-order harmonic, 5.375-order (n=5.375), 5.5-order (n=5.5), and 5.625-order (n=5.625) interharmonics above the five-order harmonic and 4.625-order (n=4.625), 4.5-order (n=4.5), and 4.375-order (n=4.375) interharmonics below the five-order harmonic are set. Likewise, for the seventh-order harmonic, 7.375-order, 7.5-order, and 7.625-order interharmonics above the seven-order harmonic and 6.625-order, 6.5-order, and 6.375-order interharmonics below the seven-order harmonic are set; 12 (=3×4) interharmonics are set in total.

One harmonic to be measured, one interharmonic above the harmonic, and one interharmonic below the harmonic may be set, of course. As the number of setup interharmonics increases, harmonic characteristic measurement accuracy improves by executing average processing, etc.

For example, the lowest frequency of the setup interharmonics is automatically initialized to the first injection frequency.

When the initialization at step S2 terminates, control goes to step S3 to immediately start measurement. At step S3, whether or not the apparatus is ready for injecting with no abnormal condition is determined.

At this time, whether or not an abnormal condition exists in the apparatus is determined from the presence or absence of an abnormal condition notification signal from the injecting section 106 and the self-diagnosis result of the measuring section 107 executed by the control processing section 116, for example.

If the apparatus is not ready for injecting, to prevent abnormal current injecting, control goes to step S4 from step S3 and the operation is stopped (terminated).

On the other hand, if the apparatus is ready for injecting, control goes to step S5 from step S3 and current of each interharmonic is injected into the power system and measurement data is collected.

Figure 9:
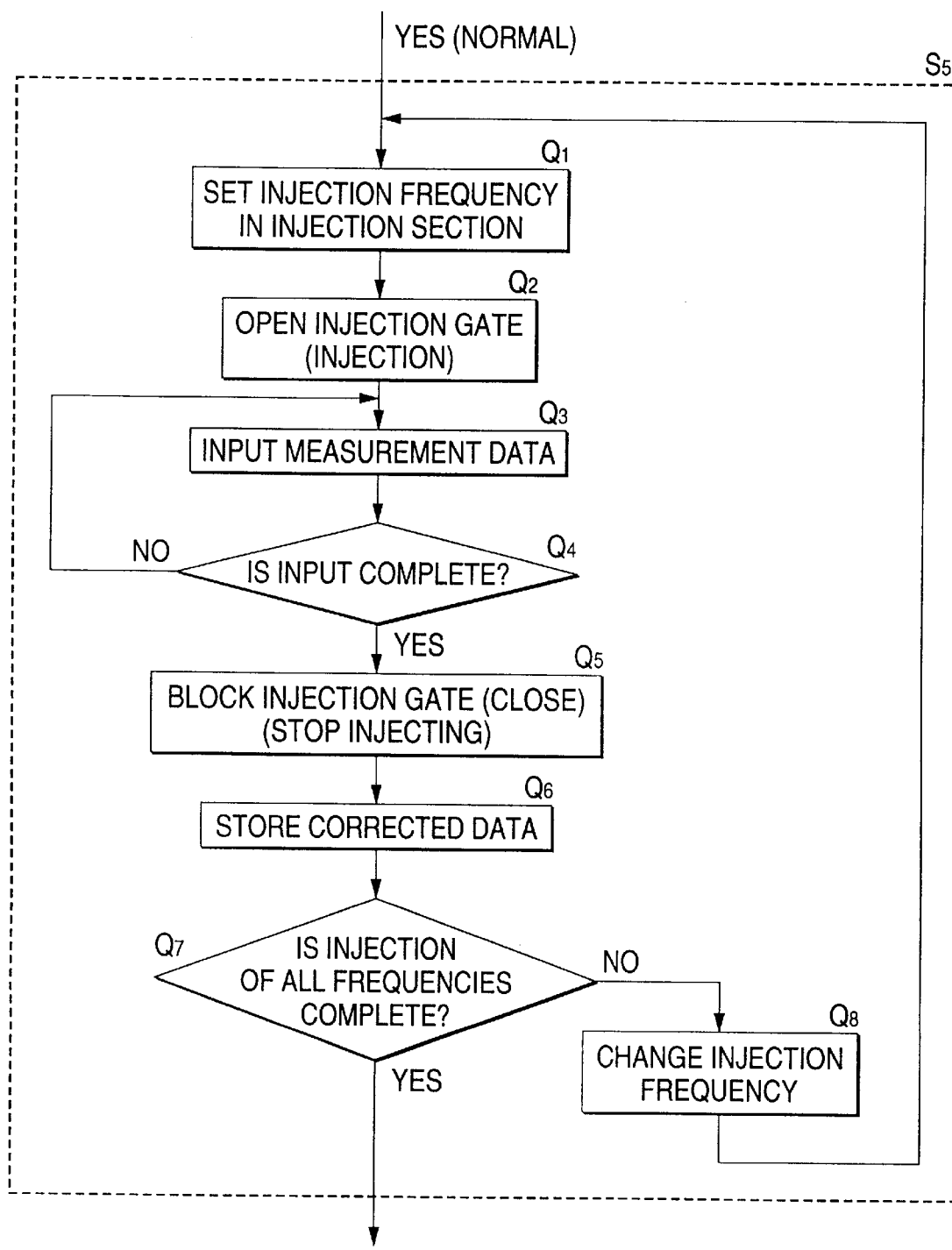
FIG. 9 is a detailed flowchart of a part in FIG. 8.

Step 55 consists of steps Q1–Q8 as shown in FIG. 9. At step Q1, for example, an inverter drive signal of a PWM waveform of the injection frequency is generated and is supplied through the input/output interface section 118 to the injecting section 106 as a injection signal.

The injection section 106 performs the switching operation according to the injection signal and is controlled to the current output state of the injection frequency.

Further, when the output frequency of the injecting section 106 is brought into the injection signal frequency and the injecting section 106 makes a transition from a transient period of output to a stable period, control goes to step Q2 according to the timer operation from the injection signal supply start, for example, and a injection gate signal from the input/output interface section 118 to the injecting section 106 is inverted from a closing command which is low to an opening command which is high, for example.

As the injection gate signal is inverted, the closed injection gate in the injecting section 106 is opened for injecting single-phase interharmonic current in the injecting section 106 into the downstream system 104 through the transformer 108.

At this time, the output current of the injection section 106 (single-phase injected current) is measured with the measuring apparatus current transformer 109 and the current and voltage of each phase in the downstream system 104 based on injecting of the interharmonic current are measured with the measuring apparatus current transformer 110 and the measuring apparatus transformer 111.

Further, signals of the measurement currents with the measuring apparatus current transformers 109 and 110 and a signal of the measurement voltage with the measuring apparatus transformer 111 are supplied to the A/D conversion section 119, which then converts the analog signals into digital measurement data in an appropriate sampling period.

At steps Q3 and Q4, tie measurement data of necessary wavelength (setup period) of the A/D conversion section 119 in the stable period is input to the RAM 117 for temporary storage.

Upon completion of the measurement data input, control goes to step Q5 at which the injection gate signal is inverted from the opening command to the closing command for blocking (closing) the injection gate for stopping injecting the interharmonic current into the downstream system 104.

Then, control goes to step Q6 and the measurement data input to the RAM 117 is transferred to and stored in the data storage section 115.

Next, at step Q7, whether or not injecting and measuring of all setup interharmonics are complete is determined. If not complete, control goes to step Q8 and the injection frequency setting is automatically changed to the frequency of the next interharmonic.

Control returns to step Q1 and the injection signal is changed to a signal of the interharmonic frequency for variably controlling the output current of the injection section 106 to current of the interharmonic.

Further, at steps Q2–Q6, the measurement data based on injecting of the interharmonic current is stored in the data storage section 115.

At steps Q7 and Q8, the injection signal is changed to a signal of the frequency of the next interharmonic, then control returns to step Q1 an the process starting at step Q1 is repeated.

Then, a similar sequence is repeated, whereby the output frequency of the injecting section 106 is changed to the frequency of each interharmonic in order and measurement data for the necessary wavelengths of all interharmonics is stored in the data storage section 115 for automatic collection.

At this time, as the injection gate is opened and closed, the collected interharmonic measurement data does not contain data in the transient period while the output frequency of the injecting section 106 is being changed to the next interharmonic, highly reliable data only in the stable period is provided.

When the output frequency of the injecting section 106 is changed to the frequency of the last interharmonic and measurement data for the interharmonic is collected, the one-time measurement for all interharmonics is complete. Then, YES is returned at step Q7 and control goes from step S5 in FIG. 8 to step S6.

If it is determined at step Q6 that one-time measurement is selected, control goes from step S6 to step S4 at which the injection signal is turned off for stopping the injecting section 106 for terminating the measurement.

By the way, during the injecting and measuring at step S5, for the protective operation to take precedence over others, the control processing section 116 accepts an abnormal condition interrupt (hardware interrupt) preferentially.

The injecting section 106 and the measuring section 107 executes a self-diagnosis program together with the measurement program by interrupt processing or parallel processing. If an abnormal condition occurs in the injecting section 106, an abnormal condition notification signal is supplied from the injecting section 106 through the input/output interface section 118 to the control processing section 116 as an abnormal condition interrupt signal. If an abnormal condition occurs in the measuring section 107, an abnormal condition interrupt occurs in the injecting section 106 based on detection of the abnormal condition.

A system monitor section (not shown) in the measuring apparatus 105 uses an overcurrent relay, an insufficient voltage relay, an overvoltage relay, etc., to monitor and detect an abnormal condition such as a short circuit, overvoltage, or insufficient voltage at the injection point in the power system. When detecting an abnormal condition, the system monitor section supplies an abnormal condition notification signal (abnormal condition interrupt signal) like the abnormal condition notification signal generated in the injecting section 106 to the control processing section 116 through the input/output interface section 118.

When an abnormal condition interrupt signal is generated, the control processing section 116 accepts the abnormal condition interrupt preferentially, immediately interrupts steps Q1–Q8 being executed, jumps to step S4, and forcibly stops injecting of the injecting section 106 for terminating the measuring.

Therefore, if an abnormal current occurs as an interharmonic current due to an abnormal condition occurring in the measuring apparatus 105, it is not injected into the power system and the facilities, etc., to which power is supplied in the power system are not adversely affected.

When an abnormal condition such as a short circuit occurs in the power system, an accident in which the injecting section 106 attempts to injection an interharmonic current and enters an overload state is prevented; the measuring apparatus 105 is also assured of safety.

Next, when continuous measurement is selected, control goes from step S1 in FIG. 8 to step S7 at which initialization as at step S2 is executed, then control goes to step S8.

At step S8, whether or not the injecting timing (start timing) of each measurement is reached is determined based on setup measurement start time and repetitive period.

When the injecting timing is reached, control goes to step 3 and a process starting at step S3 is executed for performing the first injecting and measuring by injecting currents of interharmonics into the power system in sequence as in the one-time measurement.

Then, if it is determined at step S6 that continuous measurement is selected, injecting and measuring are automatically repeated until the operator enters a measuring stop command through the keyboard, mouse, etc., of the operation section 113. Thus, control goes to step S9 and whether or not a measuring stop command is given is determined.

If no measuring stop command is given, the injection frequency is restored to the first frequency (initialized frequency) and control returns from step S9 to step S8 at which the second injecting and measuring of interharmonics are executed.

Then, control returns from step S9 to step S8 and the injecting and measuring of interharmonics are executed until a measuring stop command is given.

When a measuring stop command is given, control goes from step S9 to step S4 and the injecting and measuring are terminated.

Also in the continuous measuring, during the injecting and measuring at step S5, the control processing section 116 accepts an abnormal condition interrupt preferentially for the protective operation to take precedence over others.

Therefore, according to selection of one-time or continuous measurement, when one-time measuring is selected, interharmonic currents are injected in sequence at any timing with the selection as a trigger and meanwhile the current and voltage measurement data in the power system can be collected automatically.

When continuous measuring is selected, sequential injecting of interharmonic currents is repeated in a setup period and meanwhile the current and voltage measurement data in the power system can be collected automatically.

Thus, regardless of whether measurement is one-time or continuous measurement, the interharmonics in a wide frequency range can be injected and measured efficiently in a short time under so-called sequential control.

At the time, after the output frequency of the injecting section 106 is changed to the frequency of one interharmonic, the injection gate is opened for injecting and measuring the interharmonic current. After the measurement terminates, the injection gate is closed and the output frequency of the injecting section 106 is changed to the frequency of another interharmonic. Thus, the current in the transient period in which the frequency fluctuates is not injected and moreover erroneous current and voltage measurement data in the transient period is not collected either.

Thus, the admittance or impedance for each interharmonic in the power system can be found with accuracy and the ever-changing harmonic characteristic in the power system can be measured with accuracy based on the measurement data stored in the data storage section 115 without injecting any abnormal current to the power system.

For example, if the capacity of the RAM 117 is enlarged and step Q6 in FIG. 9 is placed between step Q7 and step S6 in FIG. 8, one sequence of injecting and measuring the harmonic currents can be executed consecutively before the data collected so far is stored in batch; the processing time can be furthermore shortened and measurement can be executed furthermore rapidly.

Since one-time or continuous measurement can be selected, appropriate measurement can be executed in response to application, etc., and an advantage of excellent operability is also provided.

Further, the protective operation against an abnormal condition takes precedence over others. If an abnormal condition to be handled instantly occurs in either the apparatus or the power system, immediately injecting of the interharmonic current is stopped and the measurement is terminated for assuring the apparatus and the power system of safety.

By the way, each interharmonic current may be a three-phase current rather than a single-phase current.

The injection point of each interharmonic current, the injecting and measuring sequence, and the like are not limited to those in the embodiment.

The invention provides-the following effects;

Based on the injection signal supplied from the measuring section 107 to the injecting section 106, the output frequency of the injecting section 106 is changed once or repeatedly to the frequency of each interharmonic and the output current of the injecting section 106 can be automatically changed once or repeatedly to the current of each interharmonic in response to one-time or continuous measurement.

As the injection gate is opened and closed based on the injection gate signal supplied from the measuring section 107 to the injecting section 106, the injecting section 107 does not injection current in the transient period in which the output frequency changes to the frequency of each interharmonic and can injection only stable currents of the interharmonics in sequence to the power system once or repeatedly.

The current and voltage measurement data in the power system based on injecting of the stable currents of the interharmonics with no transient fluctuation can be collected in the measuring section 107 automatically.

Further, if an abnormal condition occurs in the apparatus or the power system, the measuring section 107 can allow the protective operation to take precedence over others and forcibly stop injecting of the injecting section 106 for reliably preventing an abnormal current from being injected into the power system and protecting the apparatus from system abnormality, etc.

When one-time measurement is selected, the interharmonic currents can be injected in sequence into the power system only once at any timing based on a manual trigger; when continuous measurement is selected, the interharmonic currents can be injected into the power system repeatedly under timing control of the measuring section 107.

Thus, regardless of whether measurement is one-time or continuous measurement, the interharmonics in a wide frequency range can be injected and measured efficiently in a short time under so-called sequential control.

Moreover, one-time or continuous measurement can be selected, thus appropriate measurement can be executed in response to application, etc., and an advantage of excellent functionability is provided.

In addition, the protective operation against an abnormal condition takes precedence over others. If an abnormal condition to be handled instantly occurs in either the apparatus or the power system, immediately injecting of the interharmonic current can be stopped and the measurement can be terminated for assuring the apparatus and the power system of safety.

Therefore, a new measuring apparatus suitable for harmonic characteristic measurement in a power system can be provided.

Third Embodiment

A third embodiment of the invention will be discussed with reference to FIG. 10 to FIG. 12.

Figure 10:
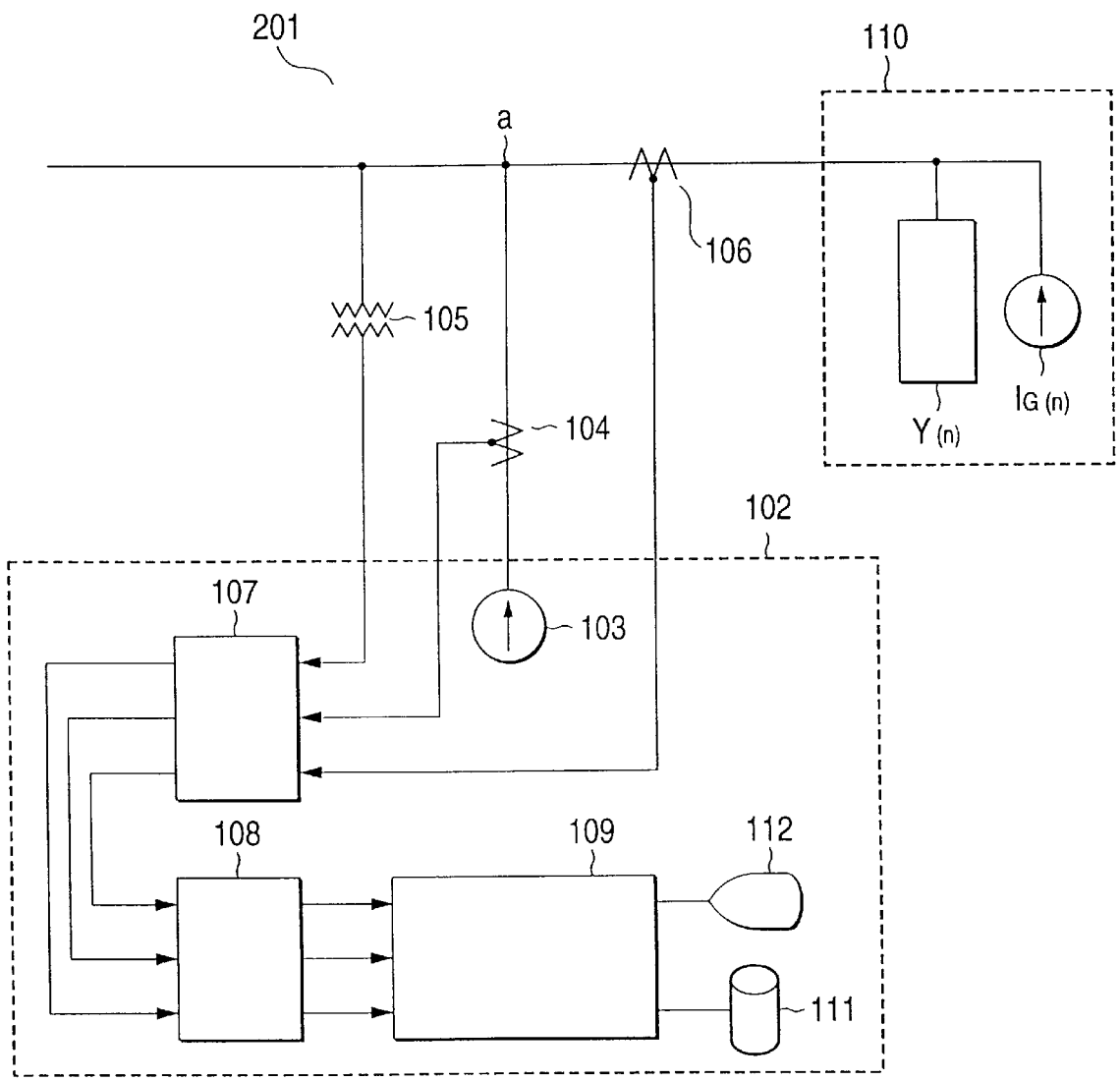
FIG. 10 is a single-line system diagram of a third embodiment of the invention.

FIG. 10 is a single-line system diagram of a power system 201 on which measurement is to be executed. A current injecting device 203 formed of an inverter, etc., in a harmonic measuring apparatus 202 is connected to a injection point a of an interharmonic current.

Assuming that the harmonic to be measured is the nth harmonic of frequency n·fs and that interharmonics of non-integral multiples of the system fundamental wave frequency fs sandwiching the harmonic are interharmonics of two frequencies f1 and f2 (f1<n·fs<f2), the current injecting device 203 repeats a sequence of generating currents of the interharmonics of the frequencies f1 and f2 in order or at the same time and injecting into the injection point a every 30 minutes, for example.

The current injected into the injection point a is measured with a measuring apparatus current transformer 204.

The voltage of the power system 101 is measured with a measuring apparatus transformer 105 and the current on the load side of the injection point a in the power system 101 is measured with a measuring apparatus current transformer 106.

Analog measurement output of the current transformers 104 and 106 and the transformer 105 are converted into digital signals by an A/D converter 107 in the harmonic measuring apparatus 102, then the digital signals are supplied to a signal processor 108.

The signal processor 108 executes a digital frequency analysis of DFT, FFT, etc., of measurement output of the current transformers 104 and 106 and the transformer 105 and detects the voltage and current at each frequency in the power system 101.

Further, the vector values of the voltage and current as the analysis result of the signal processor 108 are supplied to an arithmetic processing unit 109, which then performs vector subtraction of noise existing in the system and harmonic characteristic calculation and finds and determines an equivalent circuit (harmonic equivalent circuit) 110 for the harmonic to be measured on the downstream side (load side) of the injection point a, for example.

By the way, such an interharmonic of a frequency of a non-integral multiple of the system fundamental wave frequency fs does not essentially exist in the power system 101 and the voltage and current of interharmonic noise existing in the system are minute and can be assumed to be unchanged before, during, and after current injecting of the current injecting device 103.

Then, before and after each current of both interharmonics of the frequencies f1 and f2 is injected, the voltage and current at each frequency of both intermediate harmonics are measured as the voltage and current of noise in each frequency source existing in the system.

The times before and after a injection period sequence of injecting both intermediate harmonics are also the times before and after injecting of each of both intermediate harmonics. Thus, in the embodiment, step S11 for measuring before injecting is provided before the injection period sequence as shown in a flowchart of FIG. 11 to show a processing procedure of the harmonic measuring apparatus 102.

At step S11, the components of the frequencies f1 and f2 contained in measurement output of the transformer 105 and the current transformer 106 are measured as voltages and currents of noise existing in the system at the frequencies by digital frequency analysis of the signal processor 108 immediately before the current injecting device 103 starts injecting, and the vector values of the noise voltages and currents at the frequencies f1 and f2 measured are stored in a storage unit 111 at the stage following the arithmetic processing unit 109, for example.

Figure 11:
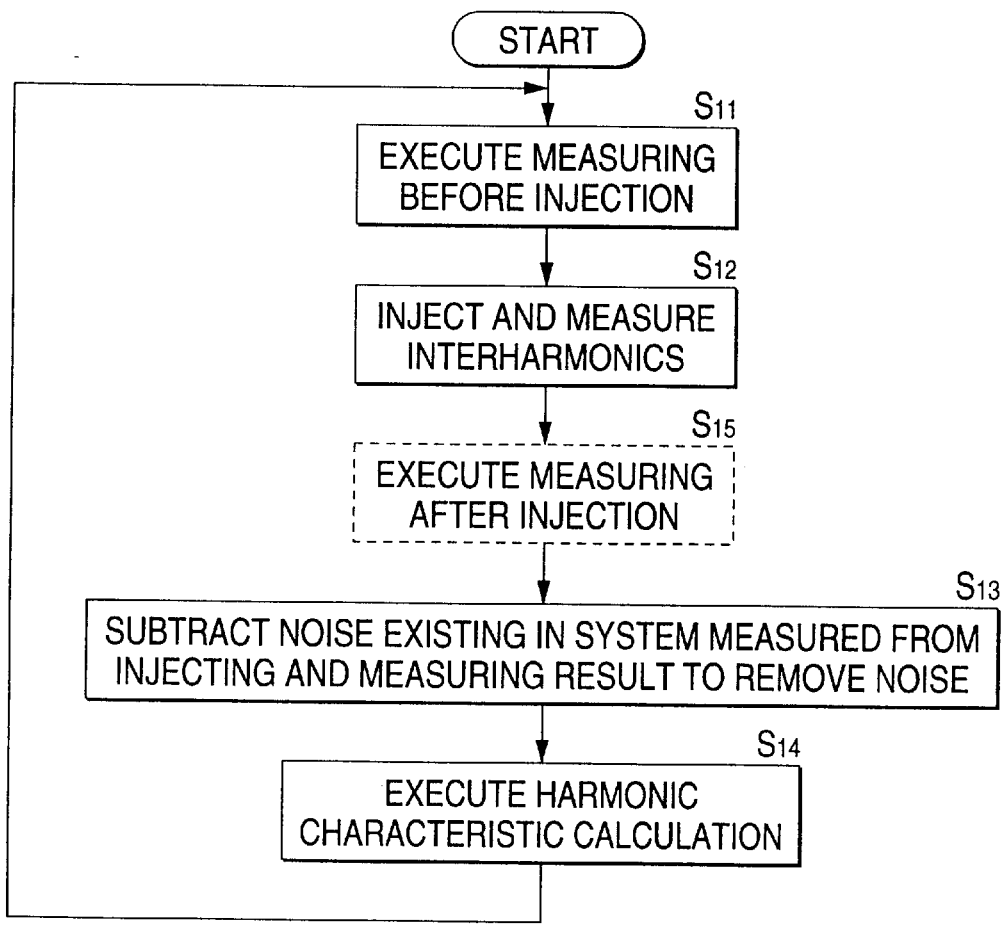
FIG. 11 is a measuring process flowchart of a harmonic measuring apparatus 102 in FIG. 10.

Next, control goes to step S12 in FIG. 11 at which interharmonic currents at the frequencies f1 and f2 are injected in order from the current injecting device 103 into the injection point a and the signal processor 108 executes a digital frequency analysis of measurement output of the current transformers 104 and 106 and the transformer 105 for detecting voltages of both interharmonics in the power system 101 based on the injecting and currents of both interharmonics on the load side of the injection point a.

At this time, if currents of both interharmonics of the measurement output difference between the current transformers 104 and 106 are found, currents of both interharmonics branching upstream from the injection point a can also be detected at the same time.

Figure 12:
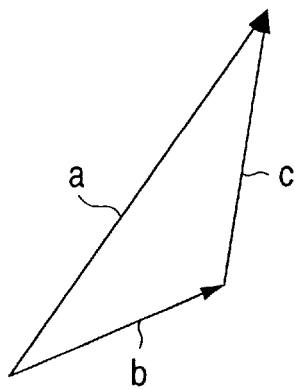
FIG. 12 is a vector diagram to describe subtraction for noise removal in FIG. 11.

After the injection period sequence terminates, the vector values of the detection result of the signal processor 18 are supplied to the arithmetic processing unit 109, which then at step S13, performs vector subtraction (complex operation) of the most recent voltages and currents of noise at the frequencies f1 and f2 existing the system stored in the storage section 111 and the voltages and currents at the frequencies f1 and f2 in the power system 101 measured based on the injecting, subtracts vector b of the voltage or current of noise existing in the system from detection vector a of the voltage or current containing noise based on the injecting for the harmonic of the frequency f1, f2 to exclude the effect of noise existing in the system and find vector c of the voltage, current corrected, and adopts the voltage, current of the vector c as the measurement voltage, measurement current based on the injecting, as shown in FIG. 12.

Further, based on the measurement voltage, measurement current from which noise at the frequency f1, f2 is removed, the arithmetic processing unit 109 executes harmonic characteristic calculation at step S14 in FIG. 11, finds constants of the equivalent circuit 110 (equivalent circuit constants) for the harmonic being measured, namely, admittance Y(n) and current source IG(n), and determines the harmonic characteristic.

That is, assuming that the measurement voltages and measurement currents at the frequencies f1 and f2 after noise removal obtained at step S13 are V1 and V2 and I1 and I2 and represented as voltage Vi and current Ii (i=1, 2), since the interharmonics do not essentially exist in the power system 101, the equivalent circuit on the load side viewed from the injection point a is only admittance Yi (=Y1, Y2)

for the frequency f1, f2 corresponding to admittance Y(n), and the admittance Yi is found from calculation of the following expression in Expression 15:

$$Yi=Ii/Vi \qquad (15)$$

For the upstream side of the injection point a, the equivalent circuit at the frequency f1, f2 is also admittance only and the admittance is found from calculation of an expression similar to Expression 15.

If the admittances Y1 and Y2 for the interharmonics of the frequencies f1 and f2 are found, the admittance Y(n) for the harmonic being measured is found from interpolation operation of n={(Y1+Y2)/2} in the simplest way.

Next, assuming that the harmonic voltage being measured in the power system 101 provided by digital frequency analysis of the signal processor 108 is V(n) and that the current of the harmonic being measured flowing into the load side of the injection point a is I(n), the current source IG(n) is found from calculation of the following expression in Expression 16:

$$IG(n)=I(n)-V(n)\cdot Y(n) \qquad (16)$$

If the admittance Yn and the current source IG(n) are found, the equivalent circuit 110 is determined and the characteristic for the harmonic being measured on the load side of the injection point a (harmonic characteristic) is found and measured.

At this time, the frequency components existing in the system measured just immediately are removed from the measurement results of the voltages and currents at the frequencies based on injecting of the interharmonic currents of the frequencies f1 and f2 and the measurement results based only on the injected currents are used to find and measure the harmonic characteristic. Thus, if the injection amount is smaller than the component existing in the system, the effect is not received, the current injecting device 103 is reduced in capacity and size, and the harmonic characteristic can be found and measured with accuracy in a small injection capacity.

The measurement result is stored in the storage section 111 and is also displayed on a screen of a display unit 112 such as a CRT.

For the upstream side of the injection point a, the admittance and current source for the harmonic being measured can also be found for measuring the harmonic characteristic in a similar technique.

By the way, the frequency components of both interharmonics existing in the system may be measured before or after the currents of both interharmonics are injected, namely, when the currents of both interharmonics are not injected.

Therefore, instead of measuring the currents of both interharmonics before the injecting sequence thereof at step S12 in FIG. 11, at step S15 surrounded by the dashed line in FIG. 11, the currents of both interharmonics may be measured after the termination of the injecting sequence thereof at step S12.

The times before and after injecting the current of each intermediate harmonic in the invention mean the time when the current of each intermediate harmonic is not injected.

When the currents of the interharmonics of the frequencies f1 and f2 are injected in sequence, for the current of the interharmonic of the frequency f1, not only the periods of steps S11 and S15 before and after step S12, but also the frequency change period during which injecting is stopped from the termination of injecting the frequency f1 or f2 in the injection period sequence to starting of injecting the frequency f2 or f1 and the injecting period of the current at the frequency f2 at step S12 are contained in the times before and after injecting.

Likewise, not only the periods of steps S11 and S15, but also the frequency change period and the injecting period of the current at the frequency f1 at step S12 are contained in the times before and after injecting the current of the interharmonic of the frequency f2.

Thus, in some cases, measuring at step S11 or S15 may be skipped and during the injecting and measuring sequence at step S12, based on the frequency analysis of the signal processor 108, the measurement result of frequency f12 when the current of the interharmonic of frequency f11 is injected and that of the frequency f11 when the current of the interharmonic of the frequency f12 is injected may be detected as voltages and currents of noise at the frequencies f11 and f12 existing in the system and may be measured at the same time as injecting and measuring.

Fourth Embodiment

Next, a fourth embodiment of the invention will be discussed with reference to FIG. 13.

Figure 13:
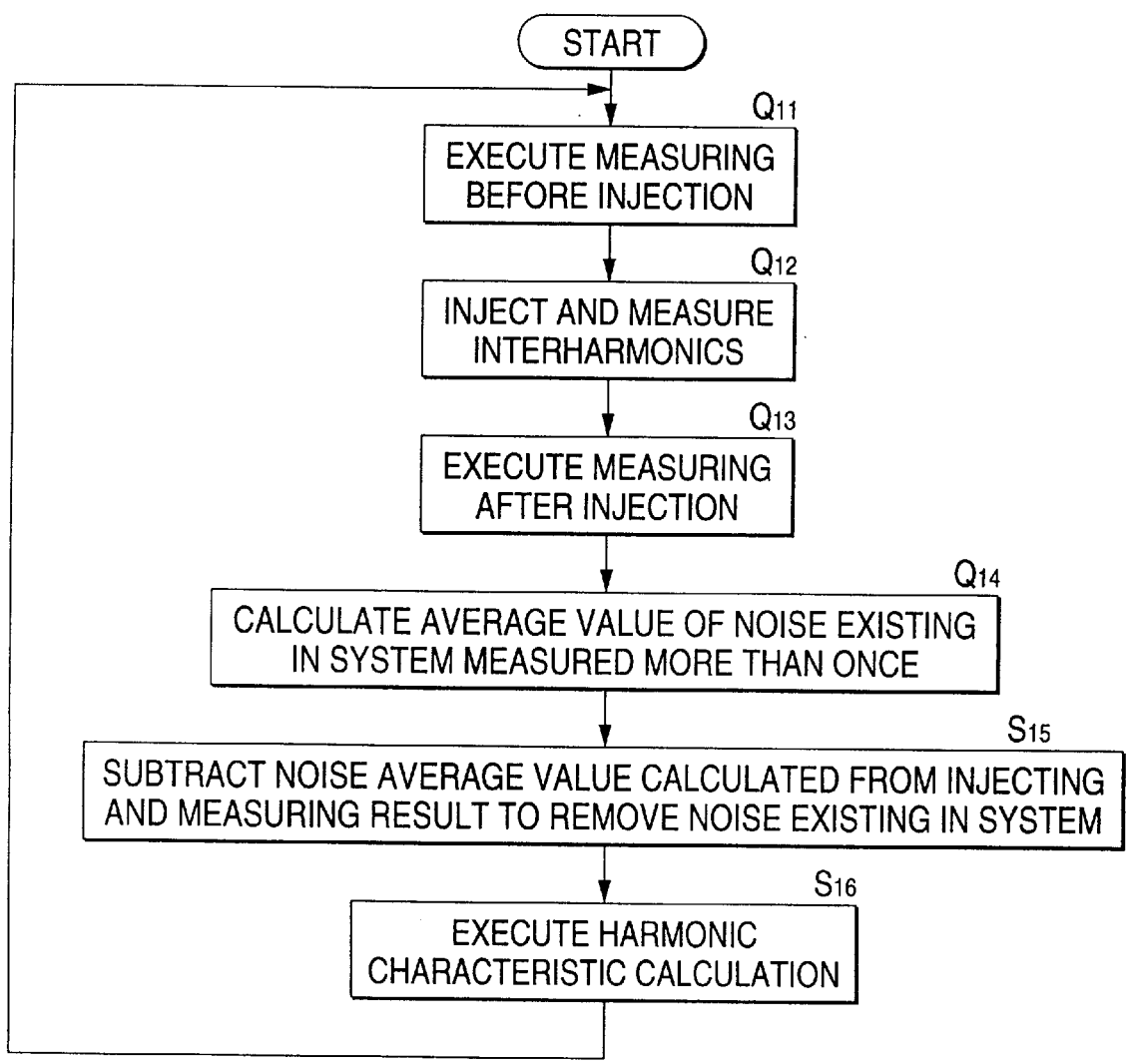
FIG. 13 is a flowchart of a measuring process in a fourth embodiment of the invention.

FIG. 13 is a flowchart of a processing procedure of the harmonic measuring apparatus 102 in FIG. 10 in the fourth embodiment.

In the fourth embodiment, to measure noise existing in a power system with accuracy, at steps Q11 (measuring before injecting) and Q13 (measuring after injecting) in FIG. 13 corresponding to steps S11 and S15 in FIG. 11, the frequency components of the interharmonics of frequencies f1 and f2 are detected from the digital frequency analysis result of the signal processor 108 in FIG. 10 and voltage and current of noise of both interharmonics existing in the system are measured more than once and are stored in a storage unit 111.

At step Q12 for injecting and measuring interharmonics in FIG. 13 corresponding to step S12 in FIG. 11, the currents of the interharmonics of the frequencies f1 and f2 are injected in order or at the same time from a current injecting device 103 into a injection point a and voltages and currents of both interharmonics in a power system 101 based on the injecting are measured from the digital frequency analysis result of the signal processor 108 and are stored in the storage unit 111.

Further, at step Q14 for calculating an average value, each time a injecting sequence of the currents of the interharmonics of the frequencies f1 and f2 terminates, vector average of each of the measurement results of the voltages and currents of noise of both interharmonics based on the measuring at steps Q11 and Q13 immediately preceding and following is calculated, the voltages and currents of noise of both interharmonics existing in the system are averaged, and average value vectors are found.

According to the average value vectors, transient (instantaneous) fluctuations of the voltages and currents of noise of both interharmonics existing in the power system 101 are averaged and the voltages and currents can be found more accurately than they are measured only once.

At step Q15 for performing vector subtraction similar to that at step S13 in FIG. 11, the average value vector of the noise existing in the system found at step Q14 is subtracted from the vector of the measurement vector of the voltage, current of both interharmonics obtained at step Q12 to exclude the effect of the noise existing in the system and the measurement voltage and measurement current based on injecting of both interharmonics are obtained.

Further, at step Q16 for executing harmonic characteristic calculation, for example, equivalent circuit constants of admittance Y(n), etc., in FIG. 10 for the harmonic being measured on the load side of the injection point a are determined and an equivalent circuit 110 is found as at step S14 in FIG. 11 based on the measurement voltage and measurement current with the noise removed.

In this case, based on the averaged voltage and current of the noise of both interharmonics existing in the system, the admittance Y(n), etc., can be found remarkably accurately without receiving the effect of transient fluctuation, etc., of noise and the harmonic characteristic in the power system 101 can be measured extremely accurately by injecting current of a small capacity.

By the way, to increase the number of measurement times of noise of both interharmonics existing in the system for improving accuracy of averaging, noise may be measured in the frequency change period from the termination of injecting the current at the frequency f1 or f2 to the starting of injecting the current at the frequency f1 or f2 at step Q12 and the current injecting period at a frequency different from the noise frequency in addition to measuring at step Q11 and measuring at step Q13 more than once.

Steps Q11 and Q13 in FIG. 13 may be skipped and at step Q12, the voltage and current of noise of the frequency f1 may be measured repeatedly in the frequency change period and during injecting and measuring of the current at the frequency f2 and the voltage and current of noise of the frequency f2 may be measured repeatedly in the frequency change period and during injecting and measuring of the current at the frequency f1. In this case, current injecting and measuring of both interharmonics and measuring of voltage and current existing in the system can be executed at the same time, shortening the measuring time and moreover, an error caused by a measuring time lag can be suppressed.

In the embodiments, the interharmonic currents are the currents at the two frequencies f1 and f2, but may be currents at frequencies of non-integral multiples of the system fundamental wave frequency fs sandwiching the harmonic to be measured and are not limited to the currents at the two frequencies f1 and f2.

The interharmonic currents may be injected all or part by part at the same time instead of sequential injecting at step S12 in FIG. 11 or step Q12 in FIG. 13, for example.

Further, the order and combination of the injection frequencies of the currents of the interharmonics may be set arbitrarily.

Next, for example, the transformer 105 and the current transformer 106 may be placed in a system upstream from the system in which the injection point a is set (injection system) or a system other than the injection system, such as a system branching from the upstream system, for measuring in a measurement system different from the interharmonic injection system.

In this case, for example, the interharmonic components existing in the measurement system are removed from the injected and measured interharmonic voltages and currents by noise removal at step S13 in FIG. 11 or step Q15 in FIG. 13. Thus, for example, if a injected current is decreased through a transforming station transformer between the systems and is injected into the upstream measurement system, the measurement result is not affected by noise and the harmonic characteristic can be measured with accuracy; the measurement range can be enlarged.

For example, each harmonic characteristic circuit on the load side and upstream side of the injection point a can also be a series circuit of impedance and a voltage source for measuring the harmonic characteristic thereof. In this case, the admittance in the embodiments may be replaced with impedance and the current source may be replaced with a voltage source.

The voltage and current at the frequency of each interharmonic in the power system before and after the current of each interharmonic is injected are measured as voltage and current of noise of each interharmonic existing in the system, and from the voltage and current of each interharmonic in the power system measured by injecting the current of each interharmonic, the voltage and current of noise existing in the system at the frequency are subtracted for removing the effect thereof. Thus, the voltage and current based on injecting of each interharmonic in the power system can be measured with accuracy by injecting current of a small capacity independently of the magnitude of existing noise at the frequency of each interharmonic in the power system, and the harmonic characteristic can be measured with accuracy in a small injection capacity.

Moreover, when the measuring system is made a different system from the injecting system, such as a system upstream from the injection system, the voltage and current of existing noise at the frequency of each interharmonic in the measuring system are measured, whereby the voltage and current of each interharmonic in the measuring system based on current injecting can be measured with accuracy and the harmonic characteristic can be measured; the measuring range can be enlarged.

Next, the voltage and current of noise at the frequency of each interharmonic existing in the system is measured furthermore accurately with transient fluctuation, etc., prevented by averaging the results of measuring more than once. The voltage and current based on injecting of each interharmonic in the power system can be measured furthermore accurately by injecting current of a small capacity. The harmonic characteristic in the power system can be measured extremely accurately in a small injection capacity and the measuring range can be enlarged furthermore.

What is claimed is:

1. A harmonic characteristic measuring method comprising the steps of:

injecting single-phase currents at two frequencies fα and fβ (fα<n·fs<fβ) of non-integral multiples of a system fundamental wave frequency fs sandwiching an n-order targeted harmonic to be measured (frequency n·fs) between two phases of a three-phase power system as interharmonic currents;

carrying out a frequency analysis of measurement current and measurement voltage of each phase in the power system and detecting a positive-phase-sequence current I1, a positive-phase-sequence voltage V1, a negative-phase-sequence current I2, and a negative-phase-sequence voltage V2 for each of the two frequencies fα and fβ in the power system based on injecting of the interharmonic currents;

finding positive-phase-sequence and negative-phase-sequence admittances Y1 and Y2 or positive-phase-sequence and negative-phase-sequence impedances Z1 and Z2 for each of the two frequencies fα and fβ in the power system as Y1=I1/V1 and Y2=I2/V2 or Z1=V1/I1 and Z2=V2/I2; and performing interpolation operation to find positive-phase-sequence and negative-phase-sequence admittances or positive-phase-sequence and negative-phase-sequence impedances for the targeted harmonic in the power system from the admittances Y1 and Y2 or the impedances Z1 and Z2 for the two frequencies fα and fβ.

2. A harmonic characteristic measuring method comprising the steps of:

injecting single-phase currents at two frequencies fα and fβ (fα<n·fs<fβ) of non-integral multiples of a system fundamental wave frequency fs sandwiching an n-order targeted harmonic to be measured (frequency n·fs) between two phases of a three-phase power system as interharmonic currents;

carrying out a frequency analysis of measurement current and measurement voltage of each phase in the power system and detecting a positive-phase-sequence current I1 and a positive-phase-sequence voltage V1 or a negative-phase-sequence current I2 and a negative-phase-sequence voltage V2 for each of the two frequencies fα and fβ in the power system based on injecting of the interharmonic currents;

finding positive-phase-sequence admittance Y1 or negative-phase-sequence admittance Y2 or positive-phase-sequence impedance Z1 or negative-phase-sequence impedance Z2 for each of the two frequencies fα and fβ in the power system as Y1=I1/V1 or Y2=I2/V2 or Z1=V1/I1 or Z2=V2/I2; and performing interpolation operation to find positive-phase-sequence or negative-phase-sequence admittance or positive-phase-sequence or negative-phase-sequence impedance for the targeted harmonic in the power system from the positive-phase-sequence admittance Y1 or the negative-phase-sequence admittance Y2 or the positive-phase-sequence impedance Z1 or the negative-phase-sequence impedance Z2 for the two frequencies fα and fβ.

3. A harmonic characteristic measuring apparatus comprising:

a current injecting device of single-phase output for injecting single-phase currents at two frequencies fα and fβ (fα<n·fs<fβ) of non-integral multiples of a system fundamental wave frequency fs sandwiching an n-order targeted harmonic to be measured (frequency n·fs) between two phases of a three-phase power system as interharmonic currents;

a current transformer for measuring the current of each phase in the power system;

a transformer for measuring the voltage of each phase in the power system;

signal processing means for carrying out a frequency analysis of three-phase measurement signals of said current transformer and said transformer and detecting a positive-phase-sequence current I1, a positive-phase-sequence voltage V1, a negative-phase-sequence current I2, and a negative-phase-sequence voltage V2 for each of the two frequencies fα and fβ in the power system based on injecting of the interharmonic currents; and arithmetic processing means for finding positive-phase-sequence and negative-phase-sequence admittances Y1 and Y2 or positive-phase-sequence and negative-phase-sequence impedances Z1 and Z2 for each of the two frequencies fα and fβ in the power system from calculation of Y1=I1/V1 and Y2=I2/V2 or Z1=V1/I1 and Z2=V2/I2 based on the detection result of said signal processing means and performing interpolation operation to find positive-phase-sequence and negative-phase-sequence admittances or positive-phase-sequence and negative-phase-sequence impedances for the targeted harmonic in the power system from the admittances Y1 and Y2 or the impedances Z1 and Z2 for the two frequencies fα and fβ.

4. A harmonic characteristic measuring apparatus comprising:

a current injecting device of single-phase output for injecting single-phase currents at two frequencies fα and fβ (fα<n·fs<fβ) of non-integral multiples of a system fundamental wave frequency fs sandwiching an n-order targeted harmonic to be measured (frequency n·fs) between two phases of a three-phase power system as interharmonic currents;

a current transformer for measuring the current of each phase in the power system;

a transformer for measuring the voltage of each phase in the power system;

signal processing means for carrying out a frequency analysis of three-phase measurement signals of said current transformer and said transformer and detecting a positive-phase-sequence current I1 and a positive-phase-sequence voltage V1 or a negative-phase-sequence current I2 and a negative-phase-sequence voltage V2 for each of the two frequencies fα and fβ in the power system based on injecting of the interharmonic currents; and arithmetic processing means for finding positive-phase-sequence admittance Y1 or negative-phase-sequence admittance Y2 or positive-phase-sequence impedance Z1 or negative-phase-sequence impedance Z2 for each of the two frequencies fα and fβ in the power system from calculation of Y1=I1/V1 or Y2=I2/V2 or Z1=V1/I1 or Z2=V2/I2 based on the detection result of said signal processing means and performing interpolation operation to find positive-phase-sequence or negative-phase-sequence admittance or positive-phase-sequence or negative-phase-sequence impedance for the targeted harmonic in the power system from the positive-phase-sequence admittance Y1 or the negative-phase-sequence admittance Y2 or the positive-phase-sequence impedance Z1 or the negative-phase-sequence impedance Z2 for the two frequencies fα and fβ.

5. In harmonic characteristic measurement of injecting currents at frequencies of non-integral multiples of a system fundamental wave frequency above and below one or more harmonics to be measured in a power system into the power system as interharmonic currents;

carrying out a frequency analysis of measurement current and measurement voltage in the power system based on injecting of the interharmonic currents, thereby detecting current and voltage of each interharmonic in the power system;

finding admittance or impedance for each interharmonic in the power system from the detected current and voltage; and performing interpolation operation to determine admittance or impedance in the power system for each harmonic being measured from the admittance or impedance for each interharmonic for measuring a harmonic characteristic in the power system, a harmonic characteristic measuring apparatus for injecting the current of each interharmonic and collecting data of the measurement current and the measurement voltage, said apparatus comprising:

a injecting section for injecting a current wherein an output frequency is variably set, said injecting section being controlled so as to injection an output current at a setup frequency into the power system or stop injecting the output current as a injection gate is opened or closed; and a measuring section having a function of controlling injecting of said injecting section and a function of collecting the data of the measurement current and the measurement voltage;

said measuring section comprises:

means for determining selection of one-time measurement of starting sequential injecting of current of each interharmonic according to a manual trigger and terminating the current injecting by executing once or continuous measurement of repeating sequential injecting of current of each interharmonic according to timing control;

means for forming a injection signal for controlling an output frequency, supplying the signal to said injection section 106, and varying the output current to current of each interharmonic in sequence once or repeatedly in accordance with selection of one-time or continuous measurement by the injection signal;

means for forming a injection gate signal for commanding the injection gate to be opened or closed, supplying the signal to said injection section, and opening the injection gate for allowing the output current to be injected into the power system in a stable period until the injection signal changes to the next interharmonic current signal after the output current changes to current of each interharmonic;

means for collecting data of the measurement current and measurement voltage in the power system in the stable period; and means for forcibly stopping injecting of said injection section and allowing protective operation to be performed preferentially when an abnormal condition occurs according to interrupt processing based on abnormal condition notification from said injecting section, abnormal condition detection in the power system.

6. A harmonic characteristic measuring method comprising the steps of:

injecting currents at frequencies of non-integral multiples of a system fundamental wave frequency sandwiching a harmonic to be measured into a power system as interharmonic currents;

finding equivalent circuit constants for the interharmonics in the power system according to measurement voltages and measurement currents of the interharmonics in the power system based on injecting of the currents;

performing interpolation operation to determine equivalent circuit constants for the harmonic being measured in the power system from the found equivalent circuit constants for the interharmonics;

measuring voltage and current at the frequency of each interharmonic in the power system before and after the current of each interharmonic is injected as voltage and current of noise of each interharmonic existing in the system; and correcting the measurement voltage and measurement current of each interharmonic in the power system based on injecting of the current of each interharmonic by subtracting the voltage and current of noise of each interharmonic.

7. A harmonic characteristic measuring method comprising the steps of;

injecting currents at frequencies of non-integral multiples of a system fundamental wave frequency sandwiching a harmonic to be measured into a power system as interharmonic currents;

finding equivalent circuit constants for the interharmonics in the power system according to measurement voltages and measurement currents of the interharmonics in the power system based on injecting of the currents;

performing interpolation operation to determine equivalent circuit constants for the harmonic being measured in the power system from the found equivalent circuit constants for the interharmonics;

measuring voltage and current at the frequency of each interharmonic in the power system before and after the current of each interharmonic is injected more than once as voltage and current of noise of each interharmonic existing in the system;

finding an average of results of measuring more than once the voltage and current of noise of each interharmonic; and correcting the measurement voltage and measurement current of each interharmonic in the power system based on injecting of the current of each interharmonic by subtracting the averaged voltage and current of noise of each interharmonic.

* * * * *

UNITED STATES PATENT AND TRADEMARK OFFICE
CERTIFICATE OF CORRECTION

PATENT NO. : 6,114,859
DATED : September 5, 2000
INVENTOR(S) : Isao KODA et al.

It is certified that error appears in the above-identified patent and that said Letters Patent is hereby corrected as shown below:

Title Page, Item [57], in the Abstact, line 3, "an targeted" should read --a targeted--.

Claim 5, col. 32, line 66, "a injecting" should read --an injecting--.

Claim 5, col. 33, line 1, "to injection" should read --to inject--.

Claim 5, col. 33, line 3, "a injection" should read --an injection--.

Claim 5, col. 33, line 17, "a injection" should read --an injection--.

Claim 5, col. 33, line 24, "a injection" should read --an injection--.

\*    Claim 7, col. 34, line 20, "steps of;" should read --steps of:--.

Signed and Sealed this

Twenty-second Day of May, 2001

*Attest:*

NICHOLAS P. GODICI

*Attesting Officer*      *Acting Director of the United States Patent and Trademark Office*